(12) United States Patent
Tower et al.

(10) Patent No.: US 10,827,139 B2
(45) Date of Patent: Nov. 3, 2020

(54) MULTIPLE WINDOW, MULTIPLE MODE IMAGE SENSOR

(71) Applicant: SRI International, Menlo Park, CA (US)

(72) Inventors: John Robertson Tower, Langhorne, PA (US); Michael Raymond Piacentino, Robbinsville, NJ (US)

(73) Assignee: SRI International, Menlo Park, CA (US)

( * ) Notice: Subject to any disclaimer, the term of this patent is extended or adjusted under 35 U.S.C. 154(b) by 0 days.

(21) Appl. No.: 16/375,059

(22) Filed: Apr. 4, 2019

(65) Prior Publication Data

US 2019/0238765 A1    Aug. 1, 2019

Related U.S. Application Data

(63) Continuation-in-part of application No. 16/175,662, filed on Oct. 30, 2018, which is a continuation of application No. 15/238,063, filed on Aug. 16, 2016, now Pat. No. 10,257,448.

(60) Provisional application No. 62/206,417, filed on Aug. 18, 2015, provisional application No. 62/652,891, filed on Apr. 4, 2018.

(51) Int. Cl.
| | |
|---|---|
| *H04N 5/335* | (2011.01) |
| *H04N 5/355* | (2011.01) |
| *H01L 27/146* | (2006.01) |
| *H04N 5/374* | (2011.01) |
| *H04N 5/353* | (2011.01) |
| *H04N 5/378* | (2011.01) |

(52) U.S. Cl.
CPC ....... *H04N 5/355* (2013.01); *H01L 27/14603* (2013.01); *H01L 27/14612* (2013.01); *H01L 27/14614* (2013.01); *H01L 27/14621* (2013.01); *H01L 27/14641* (2013.01); *H01L 27/14643* (2013.01); *H04N 5/3535* (2013.01); *H04N 5/3559* (2013.01); *H04N 5/378* (2013.01); *H04N 5/3741* (2013.01)

(58) Field of Classification Search
CPC .................................................... H04N 5/3745
USPC .................................................. 348/294, 297
See application file for complete search history.

(56) References Cited

U.S. PATENT DOCUMENTS

| | | |
|---|---|---|
| 3,953,733 A | 4/1976 | Levine |
| 7,020,353 B1 | 3/2006 | McCaffrey et al. |
| 8,445,828 B2 | 5/2013 | He |

(Continued)

OTHER PUBLICATIONS

Final Office Action for U.S. Appl. No. 15/238,063 dated May 1, 2018, 14 pages.

(Continued)

*Primary Examiner* — Anthony J Daniels
(74) *Attorney, Agent, or Firm* — Rutan & Tucker, LLP

(57) ABSTRACT

Systems, Methods, and Apparatuses for an image sensor and a control system to cooperate with each photodiode in individual pixels to allow multiple pixels in a set of pixels to operate in a different imaging-mode of operation simultaneously within multiple window regions of the image. The image sensor has multiple window regions each capable of operating in different operating modes. Each pixel contains multiple photodiodes. The imager is fabricated with an additional semiconductor layer containing one or more metallization layers for interconnections and providing active CMOS circuits for control.

20 Claims, 19 Drawing Sheets

(56) References Cited

U.S. PATENT DOCUMENTS

| | | |
|---|---|---|
| 8,766,157 B2 | 7/2014 | Levine et al. |
| 2007/0023798 A1 | 2/2007 | McKee |
| 2007/0035649 A1 | 2/2007 | McKee |
| 2009/0086074 A1 | 4/2009 | Li et al. |
| 2011/0019049 A1 | 1/2011 | Jin et al. |
| 2013/0300904 A1 | 11/2013 | Sugiyama et al. |
| 2015/0055000 A1* | 2/2015 | Bock ................ H04N 5/35554 348/308 |
| 2015/0201140 A1 | 7/2015 | Solhusvik et al. |
| 2015/0312557 A1 | 10/2015 | Kim |
| 2015/0350583 A1 | 12/2015 | Mauritzson et al. |
| 2016/0028985 A1 | 1/2016 | Vogelsang et al. |
| 2016/0037109 A1 | 2/2016 | Vogelsong |
| 2017/0034411 A1 | 2/2017 | Okura et al. |
| 2017/0180667 A1 | 6/2017 | Nie et al. |
| 2019/0014273 A1* | 1/2019 | Geurts ................ H04N 5/3454 |

OTHER PUBLICATIONS

Advisory Action Before the Filing of an Appeal Brief for U.S. Appl. No. 15/238,063 dated Aug. 13, 2018, 3 pages.
Advisory Action Before the Filing of an Appeal Brief for U.S. Appl. No. 15/238,063 dated Sep. 6, 2018, 3 pages.
Non-Final Office Action for U.S. Appl. No. 15/238,063 dated Nov. 6, 2017, 14 pages.
AFCP 2.0 Decision for U.S. Appl. No. 15/238,063 dated Sep. 6, 2018, 1 page.

\* cited by examiner

High Dynamic Range EXPOSURE SEQUENCE 1600

PIXELS #1 and #3 RESET: $t_0$

PIXEL #2 RESET: $t_j$

PIXEL #4 RESET: $t_k$

PIXELs 1,2,3 and 4 READ: $t_n$

TIME →

- PIXELS #1 and #3 binned with EXPOSURE TIME: $t_n - t_0$
- PIXEL #2 EXPOSURE TIME: $t_n - t_j$
- PIXEL #4 EXPOSURE TIME: $t_n - t_k$

Fig. 16

MULTIPLE WINDOW, MULTIPLE MODE IMAGE SENSOR

CROSS-REFERENCE TO RELATED APPLICATIONS

This application claims the benefit under 35 USC 121 and priority to, as a continuation in part of, U.S. application Ser. No. 16/175,662 (SRI Ref. No. US-7276-3) titled "Extended dynamic range imaging sensor and operating mode of the same," filed on Oct. 30, 2018, which claimed the benefit as a continuation application of U.S. patent application Ser. No. 15/238,063 (SRI Ref. No. US-7276-2) titled "Extended dynamic range imaging sensor and operating mode of the same," filed on Aug. 16, 2016, which claimed the benefit of U.S. Provisional Patent Application Ser. No. 62/206,417 filed on Aug. 18, 2015 and entitled "Extended dynamic range (XDR) CMOS pixel and operating mode under 35 USC 119. Additionally, this application claims the benefit under 35 USC 119 and priority to U.S. provisional patent application Ser. 62/652,891, titled "Methods for enhanced imaging based on semantic processing and dynamic scene modeling," filed: 4 Apr. 2018, all of which are incorporated herein by reference in their entirety.

STATEMENT REGARDING FEDERALLY SPONSORED RESEARCH

This invention was made with government support. The government has certain rights in the invention.

BACKGROUND OF THE INVENTION

The field of the invention relates generally to imaging devices. More particularly, the present disclosure is directed to complementary metal-oxide-semiconductor ("CMOS")-based imaging sensors capable of a wide range of operation.

Imagers typically include an array of pixels that contain light-sensitive elements commonly known as photodetectors, such as CMOS or charge-coupled device ("CCD") sensors. In general, photodetectors accumulate charge in accordance with the incident light during what is known as an integration period. If a photodetector becomes full, or saturated, before the end of the integration period, additional light from a bright scene striking the photodetector does not accumulate any further charge, and stores no further information.

CMOS image sensors first came to the fore in relatively low-performance applications where scene dynamic range was low, and moderate to high noise levels could be tolerated. A CMOS sensor technology enabling a higher level of integration of an image array with associated processing circuits would be beneficial to many digital applications such as, for example, in cameras, scanners, machine vision systems, vehicle navigation systems, video telephones, computer input devices, surveillance systems, star trackers, motion detection systems, image stabilization systems, and high-definition television imaging devices.

SUMMARY

Systems, Methods, and Apparatuses for an image sensor and a control system to cooperate with each photodiode in an individual pixel to allow multiple pixels in a set of pixels to operate in a different imaging-mode of operation simultaneously within each row making up the image. The image sensor has multiple window regions. The set of pixels within a first row in a first window region can operate in a first imaging-mode of operation while simultaneously the set of pixels within the first row in a second window region can operate in a second imaging-mode of operation, and so on. Each pixel contains multiple photodiodes. Each pixel is fabricated with an additional semiconductor layer to generate and route wire traces for the control signals.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 16 illustrates an embodiment of timing diagram of the control system conducting an extended dynamic range exposure timing sequence for the integration times for the four example photodiodes.

The foregoing and other aspects and advantages of the invention will appear from the following description. In the description, reference is made to the accompanying drawings that form a part hereof, and in which there is shown by way of illustration preferred embodiments of the invention. Such embodiments do not necessarily represent the full scope of the invention, however, and reference is made therefore to the claims and herein for interpreting the scope of the invention.

DETAILED DESCRIPTION OF THE INVENTION

FIGS. 1-5 discuss an example image sensor with a wide dynamic range and will be discussed in more detail later.

Figure 6:
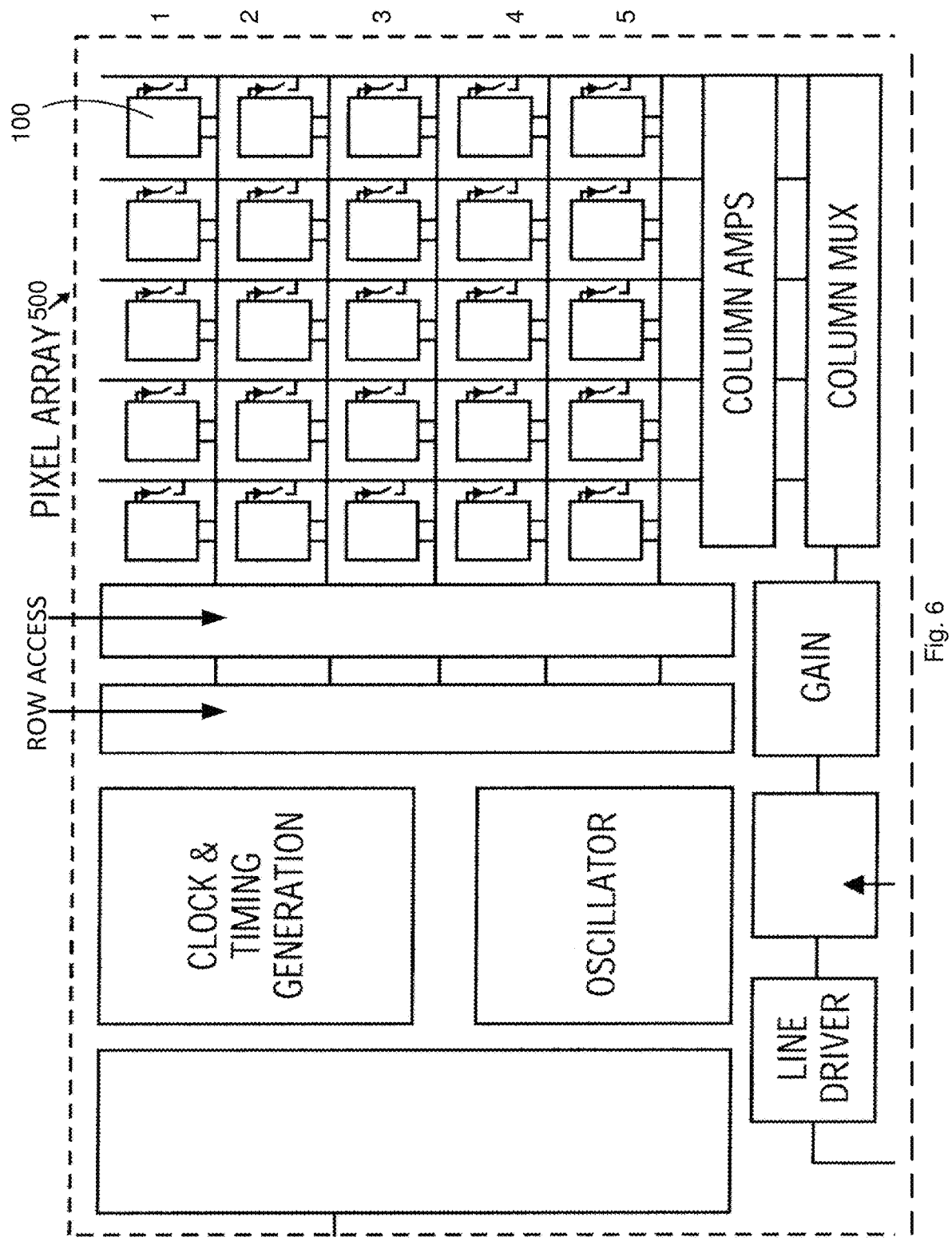
FIG. 6 illustrates an embodiment of a block diagram of an example image sensor having a set of pixels making up the image sensor to capture an image.

FIG. 6 illustrates an embodiment of a block diagram of an example image sensor having a set of pixels making up the image sensor to capture an image. The image sensor has an array 500 with columns and rows of pixels. In this example, the image sensor, configured to capture an image, has five rows and columns of pixels (rows 1-5). Each pixel in a given row can operate in a different imaging-mode of operation and different timing than another pixel in that row of the image.

Figure 8:
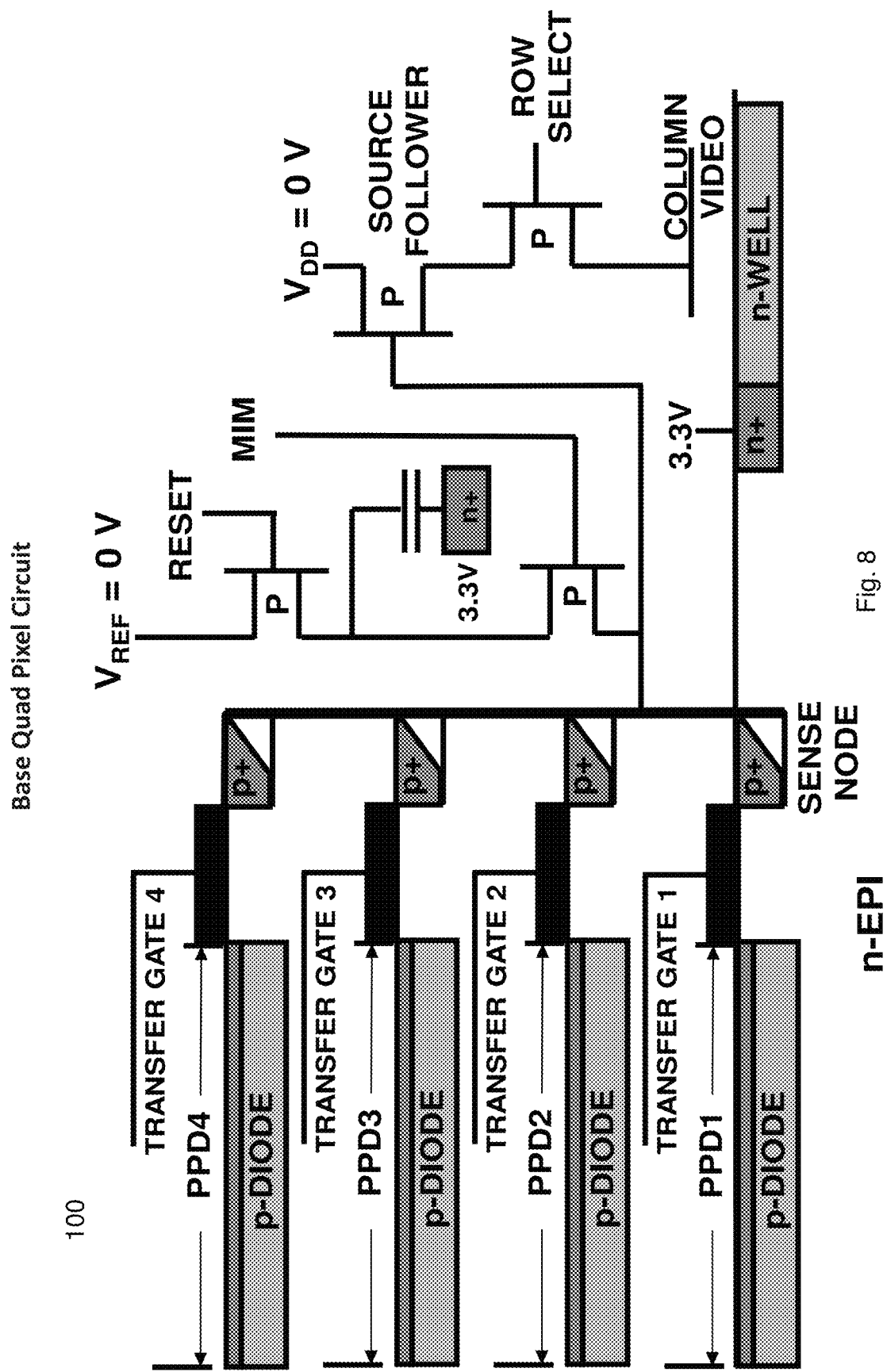
FIG. 8 illustrates an embodiment of a block diagram of an example pixel in a base state.

FIG. 8 illustrates an embodiment of a block diagram of an example pixel in a base state. The example pixel 100 has a quad pixel design with four photodiodes, PPD1-PPD 4, connecting to a common sense node. The pixel 100 employs multiple photodiodes, e.g. PPD1-PPD 4, which each have an independent transfer gate (transfer gate1-transfer gate4) to a common sense node. The common sense node is used for reading out each of the four independent photodiodes in this example. The common sense node can also be used for combining charge from the two or more photodiodes to perform noiseless, charge domain binning. The pixel 100 employs a series metal insulator metal (MIM) capacitor selectively connected to the sense node after the reset operation. When the MIM capacitor is not connected, the sense node has a much lower capacitance and can achieve a high conversion gain to achieve lower readout noise. The sense node reset occurs when both the RESET and the MIM gates are turned on. The signal is readout using the source follower and the row select transistor, producing a voltage signal on the column bus (which has a current source load). The four readout transistors are labeled: Source Follower, ROW Select, MIM, and RESET.

Figure 7:
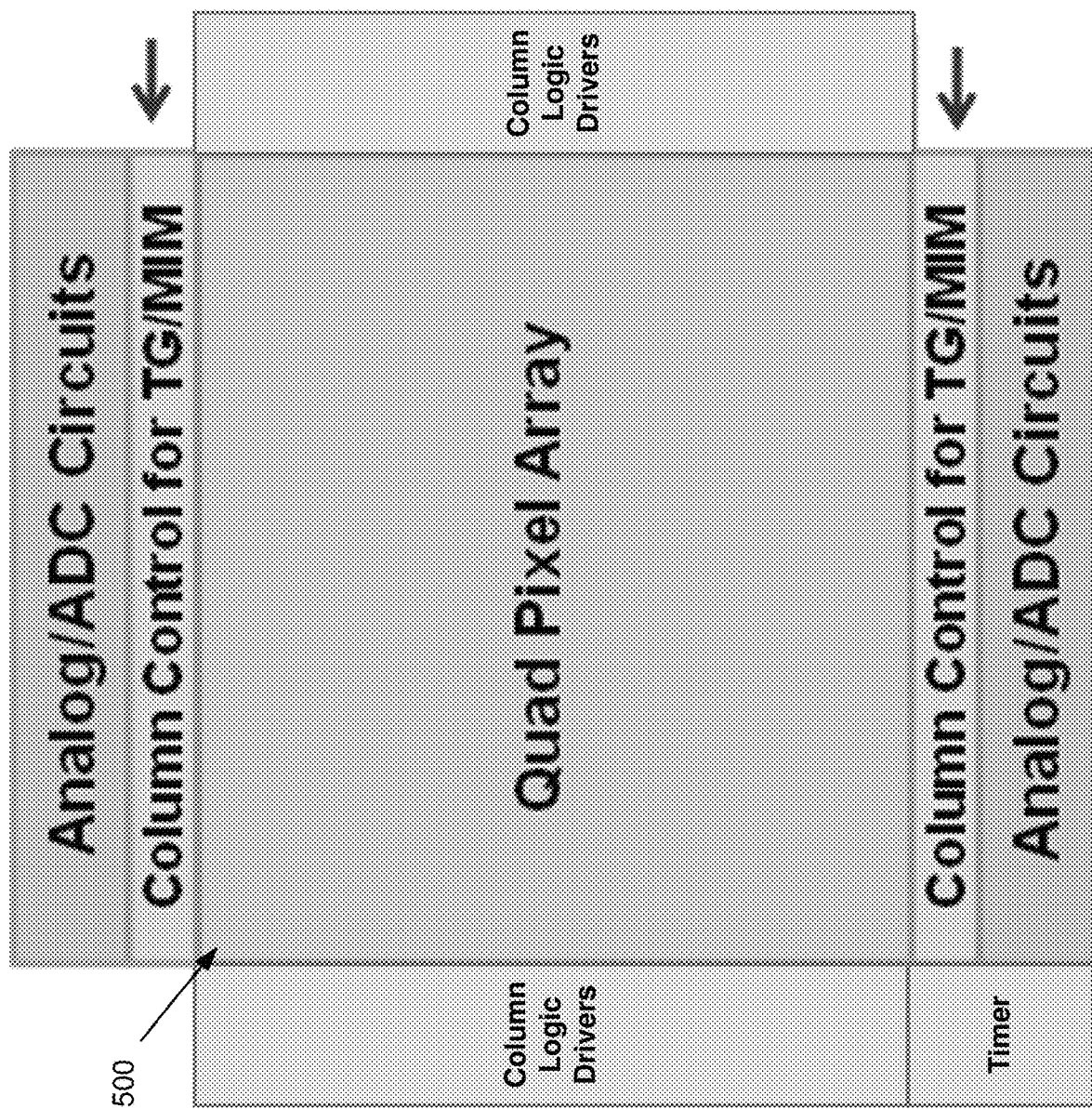
FIG. 7 illustrates an embodiment of a block diagram of a control system and pixel array for an image sensor having a set of pixels making up the image sensor to capture the image, where each pixel has an architecture that includes multiple photodiodes forming the individual pixel similar to the example pixels shown in FIGS. 1-5.

FIG. 7 illustrates an embodiment of a block diagram of a control system and pixel array for an image sensor having a set of pixels making up the image sensor to capture the image, where each pixel has an architecture that includes multiple photodiodes forming the individual pixel similar to the example pixels shown in FIGS. 1-5. The control system may include components such as a controller having two or more decoders implemented in Analog/ADC circuits, a column and row control circuit for each transfer gate of the photodiodes, the MIM gain capacitor, the Reset switch, and the Row select switch, column logic drivers, and a timing circuit.

The control system can use two or more decoders. The two or more decoders cooperate with a timer to direct control signals to control i) frame rate, ii) integration times of the multiple photodiodes, and iii) binning of the multiple photodiodes on a per pixel basis to allow multiple pixels in the array 500 of pixels to operate in the different imaging-modes of operation simultaneously in different windows, all within a time frame of one image frame.

The control system can use two or more decoders that are each configured to control a different aspect of putting each pixel into its imaging-mode of operation. For example, a first decoder cooperating with the timer can direct the control signals to the transfer gates for each of the multiple photodiodes and the gate for the Row select to tell the image sensor what one or more pixel locations and what row of the image sensor will be readout at that time. Also, a second decoder cooperating with the timer can direct the control signals to control an integration time for each photodiode and whether the gain capacitor should connect or not connect to the common sense node to control gain.

The transfer gates, such as a transistor, metal oxide device, etc., for each photodiode have control signals going to them to control the integration time for that particular photodiode; and thus, how long that photodiode collects photons before its associated transfer gate allows the accumulated charge in the photodiode to be sensed at the common sense node. Also, a control signal controls the gate connecting the MIM gain capacitor to the sense node. The MIM gain capacitor can be selectively connected to the sense node during a read out to modify the capacitance of the sense node; and thus, have a lower gain (when connected) or higher gain (when not connected).

The column control signals can be coordinated with the row control signals to address and control the array of pixels. A column control serial data bus can load logical 1 and 0 values as control signals to every row, the transfer gates 1-4 of the photodiodes, and the MIM gain capacitor, for each of the selected pixels. The selected pixels can be selected with a logical 1 control bit and/or default to a transfer gates 1-4 to an off state and a high gain MIM state.

One or more additional metallization layers on the second semiconductor plane of the fabricated chip can be a control signal plane to generate control signals and route wire traces/conductor paths. The control signal plane couples to logic and analog circuits capable of routing the driver signals to the four transfer gates and the MIM switch. The control signal plane provides a spacious platform for the control signals to the transfer gates 1-4 and MIM capacitor signals from the imaging plane drivers. The control signal plane also provides the row and column select signals. Each row time from the column control, can be loaded in coordination with the row control.

Referring back to FIG. 8, the imaging sensor captures lighting conditions in an image, selectively in any of its pixels, that extend over a wide dynamic range. Each pixel 100 includes two or more photodiodes coupled to a sense node, each photodiode having connected thereto a different transfer gate for selectively controlling a charge accumulation therein due to an incident light collected; a gain capacitor, a Reset switch, and a Row select switch.

The image sensor and its pixels capture an image containing imaging conditions, such as i) low or bright lighting conditions that extend over a wide dynamic range, ii) objects requiring high frame rates or short integration times to minimize motion blur, iii) etc. and then potentially selecting a different integration time for at least two photodiodes in the pixel 100 based on imaging conditions captured by the pixel 100. Each photodiode is controlled using a different transfer gate.

The readout circuitry connects to the sense node and includes a reset transistor, a source follower transistor, and a row select transistor. The readout circuitry connects to the sense node of the pixel 100. A capacitance associated with the sense node can be modified during the readout of the at least two photodiodes. The capacitance associated with the sense node can be modified by selectively connecting a gain capacitor to the sense node. The gain capacitor can selectively connect to the sense node and readout circuitry when measuring the charge accumulation for one or more of the photodiodes.

The control system is configured to analyze the scene being captured in an image. The control system selects different imaging-modes of operation for two or more pixels in a row based on imaging conditions in the scene content, such as different light intensities and frame rate needed, within the scene being captured by the plurality image pixels. The controller may operate the imaging sensor by:

selecting a different imaging-mode of operation for at least two pixels based on imaging conditions captured in the pixel 100;

performing a readout of the pixel 100, wherein a capacitance associated with the sense node can be modified during the readout of the photodiodes; and assembling an image using collected data signals reflective of the accumulated charge and other imaging conditions obtained from a plurality of pixels from the readout.

MODES

Thus, the image sensor permits operating a CMOS image sensor with multiple imaging-modes of operation simultaneously with different pixels on a given row of pixels in multiple windows in the image sensor. Thus, some pixels may run in extended dynamic range mode, some pixels may run in a high frame rate mode, etc.

The control system connects with each photodiode in the individual pixel 100 to allow multiple pixels in the set of pixels to operate in a different imaging-modes of operation in different windows simultaneously within each row making up the image. Note, the image sensor can have multiple window regions making up a full field of vision of the image captured by the image sensor. For example, the set of pixels within a first row in a first window region can operate in a first imaging-mode of operation while simultaneously the set of pixels within the first row in a second window region can operate in a second imaging-mode of operation, and so on.

The multiple windows, multiple mode image sensor permits operating a CMOS image sensor with multiple operating modes in multiple windows simultaneously. Conventional row based readout CMOS image sensors may support windowing to introduce new operating modes but can only support one imaging mode on a given row. This design overcomes this limitation. To achieve the desired multiple window, multiple mode operation, the imager is fabricated with at least a second semiconductor layer containing one or more metallization layers for wire trace interconnections and providing active CMOS circuits for control. The imager uses image processing that optimizes multiple operating modes within each frame for improved imagery and image understanding.

The image sensor has a second semiconductor plane with one or more additional layers of metallization to route the wire traces/conductor paths for the control signals to allow different modes of operation with the example quad pixel/ electrical circuit. The circuit architecture can be the same for all of the pixels operating in different imaging modes of operation. The controller may control the timing of control signals to each pixel 100 in each row of the imager in order to achieve the envisioned imaging-modes of operation that include:

1.) An unbinned photodiode readout of photodiodes, each potentially with a different integration time for a high resolution.

2.) A binned photodiode readout of photodiodes with multiple photodiodes having their accumulated charge from their integration times binned together for a high sensitivity.

3.) Subframe integration time control.

4.) A high frame rate for motion adaptive signal integration (MASI) and/or short integration time with high gain for motion blur reduction.

5) Extended dynamic range from low lighting conditions to bright sunny conditions. And 6.) On a per readout basis of the photodiodes making up that pixel 100, use a high or low gain selection for any of i) the unbinned photodiode readout mode, ii) the binned photodiode readout mode, iii) the high frame rate mode, and/or iv) the optimum extended dynamic range mode.

i. The unbinned photodiode readout mode can be an imaging-mode of operation using a readout of photodiodes from a pixel 100, where all of the photodiodes have a different integration time.

ii. The binned photodiode readout mode can be an imaging-mode of operation using a readout of photodiodes from a pixel 100 with multiple photodiodes having their accumulated charge from their integration times binned together. Thus, binning may occur where the charge from multiple photodiodes connecting to the common sense node is physically added together, increasing the effective exposure, sensitivity; and thus, a better resolution. The controller can bin any combination, for example, of two, three, or four photodiodes to collect and read out charge/signal level. The controller and the timer cooperate to have transfer gates of binned photodiodes pulsed all at a same time with other binned photodiodes.

iii. A high frame rate for motion adaptive signal integration (MASI) can be an imaging-mode of operation using a readout of photodiodes from a pixel 100 with multiple photodiodes. The high frame rate MASI algorithm achieves a high dynamic range by combining high frame rate images of varying exposures. The high frame rate mode can still implement binning, unbinning, and extended dynamic range in a given pixel 100. Note, a high frame rate could also cut out a certain amount of rows or even individual pixels from being read to match a data throughput of the image sensor. Thus, the first decoder can select a sub set of the rows, such as 60 rows, which will have their charge readout from a total amount of rows, such as 80 rows, making up that image sensor.

iv. An extended dynamic range imaging-mode of operation can be an imaging-mode of operation using a readout of photodiodes from a pixel 100 with multiple photodiodes. The dynamic range is a metric of how well a sensor can measure an accurate signal at low light intensities all the way up until it reaches full well capacity.

A controller and a timer can enable a high or low gain selection, on a per readout basis, for i) the unbinned photodiode readout mode, ii) the binned photodiode readout mode, iii) the high frame rate mode, and/or iv) extended dynamic range mode. Gain can be a setting that controls the amplification of the signal from the one or more photodiodes being readout. For high gain, the control signal to the gate for the MIM capacitor is off during the readout. For low gain, the control signal to the gate for the MIM capacitor is on during the readout at the sense node.

Figure 2:
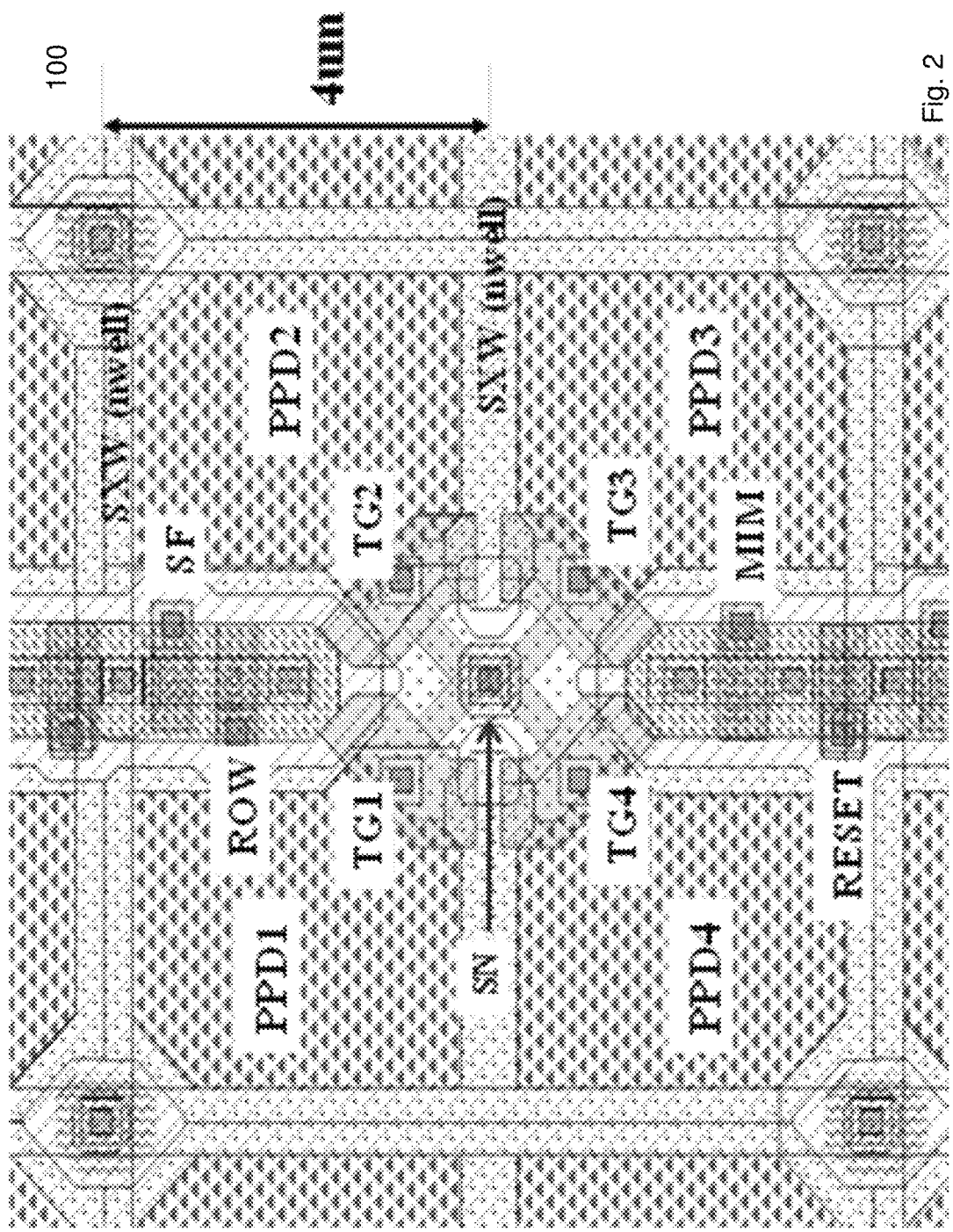
FIG. 2 illustrates an embodiment of a diagram of an example a CMOS pixel with four photodiodes in a pixel on a substrate.

FIG. 2 illustrates an embodiment of a diagram of a representation of a CMOS pixel 100 with four photodiodes in a pixel 100 on a substrate.

The four photodiodes are shown with their transfer gates (i.e. TG1). The common sense node is labeled in the center (SN). The four readout transistors are labeled: SF, ROW, MIM and RESET.

In an embodiment, each pixel 100 includes a substrate; two or more photodiodes formed in the substrate that are coupled to a sense node.

Additional layers are added on the semiconductor layers for generating and routing control signal wire traces on the fabricated chip. The additional layer(s) allows more room to fit enough control signals to control each of the photodiodes, the gain capacitor, the gate for Reset and the gate for Row select in each pixel 100 on an individual pixel basis.

The control system is configured to use one or more decoders cooperating with a timer and wire traces routed in a metallization layers making up the image sensor. One or more of the pixels have at least four transfer gates each coupled to a corresponding photodiode in that pixel 100. The one or more decoders cooperating with the timer and the conductors routed in the silicon layer (different from the layer forming the photodiodes) direct control signals to operate each pixel 100 independently of another pixel 100, on a per pixel basis, in the row.

This second (or more) semiconductor planes can be added by wafer stacking and wafer-to-wafer connections by means such as direct bond interconnect technology.

The example first semiconductor layer can have the pixels (photodiodes and transfer gates and sense node and gain capacitor and source follower, select, MiM and reset transistors). The example first semiconductor layer can be backside illuminated (BSI), with pixel circuits on the frontside of the semiconductor. The second or more semiconductor layers can have control circuits (timers) and readout circuits with metallization layers for routing. The two or more semiconductor layers can be interconnected with direct bond interconnect technology (DBI) and through silicon vias (TSV).

As discussed, the control system uses one or more decoders cooperating with a timer to direct control signals to i) transfer gates for each of the multiple photodiodes in the individual pixel 100 to control an integration time for that photodiode, ii) a gate for a gain capacitor connecting to a common sense node to alter a gain applied to an accumulated charge from one or more of the photodiodes being sensed and read out, and iii) a gate for row select. Thus, a pixel 100 such as a first pixel, can be directed to operate in a first imaging-mode of operation in a first window and another pixel, such as a second pixel, in the same row can be directed via the control signals to operate in a different imaging-mode of operation in a second window.

To achieve the desired multiple window, multiple mode operation, an additional plane is added to provide space for i) control signals from a controller to the four transfer gates (transfer gate1, transfer gate2, transfer gate3, transfer gate4) and the MIM capacitor (shown, for example, in FIG. 8) ii) for each pixel in the array iii) on an individual basis.

In this quad pixel configuration, the transfer gates control the gating of the charge signal to the common sense node. Control of these gates and the row control signals (Reset and Select) permit the multiple imaging-modes of operation. These transfer gates control binning or not binning, sub-frame integration control by transferring unwanted charge to the sense node/reset drain, extended dynamic range by adjusting the effective integration time of the four photodiodes, and readout at high speed.

Figure 9:
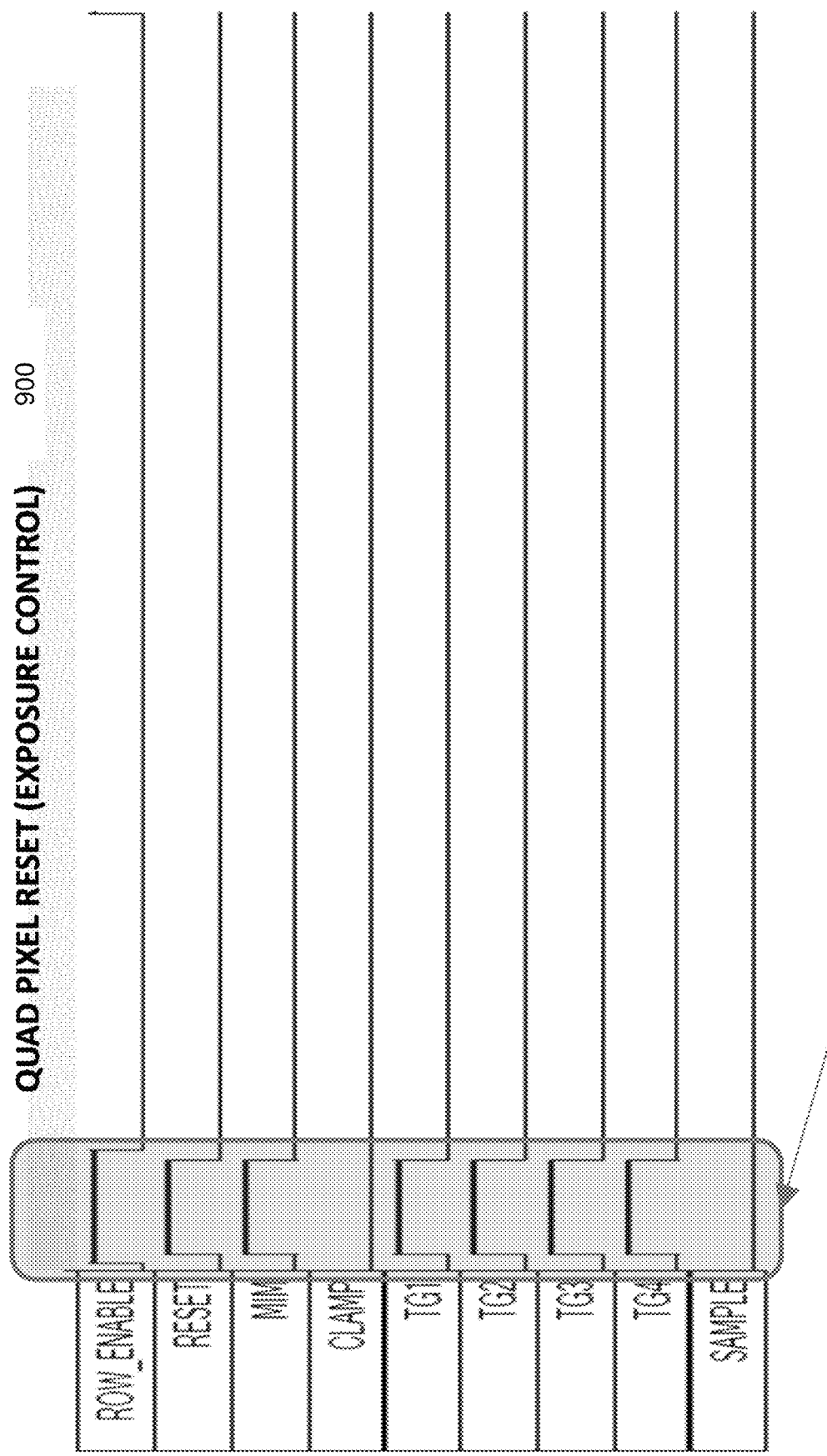
FIG. 9 illustrates an embodiment of timing diagram of the control system operating a quad pixel reset (exposure control).

FIG. 9 illustrates an embodiment of timing diagram 900 of the control system operating a quad pixel reset (exposure control).

The controller and the timer send control signals to activate the gates for the RESET switch, MIM capacitor, and transfer gates TG1-4 to all be on at the same time to reset the pixel. The decoder of the controller works with the timer to send a control signal to a row where the imager wants to dump the charge in a photodiode to reset the integration time for one or more photodiodes that have been accumulating charge up to that point. In this example, charge is removed from all four of the photodiodes and the Sense Node. The photodiodes are now in a base state, such as shown in FIG. 8, to start integration for any of the multiple photodiodes in the pixel 100.

A decoder cooperating with the timer is now responsible for sub pixel integration time (short, intermediate, or long) for each of the photodiodes. The figures below will discuss various imaging-modes of operation and how each photodiode is controlled.

Figure 10:
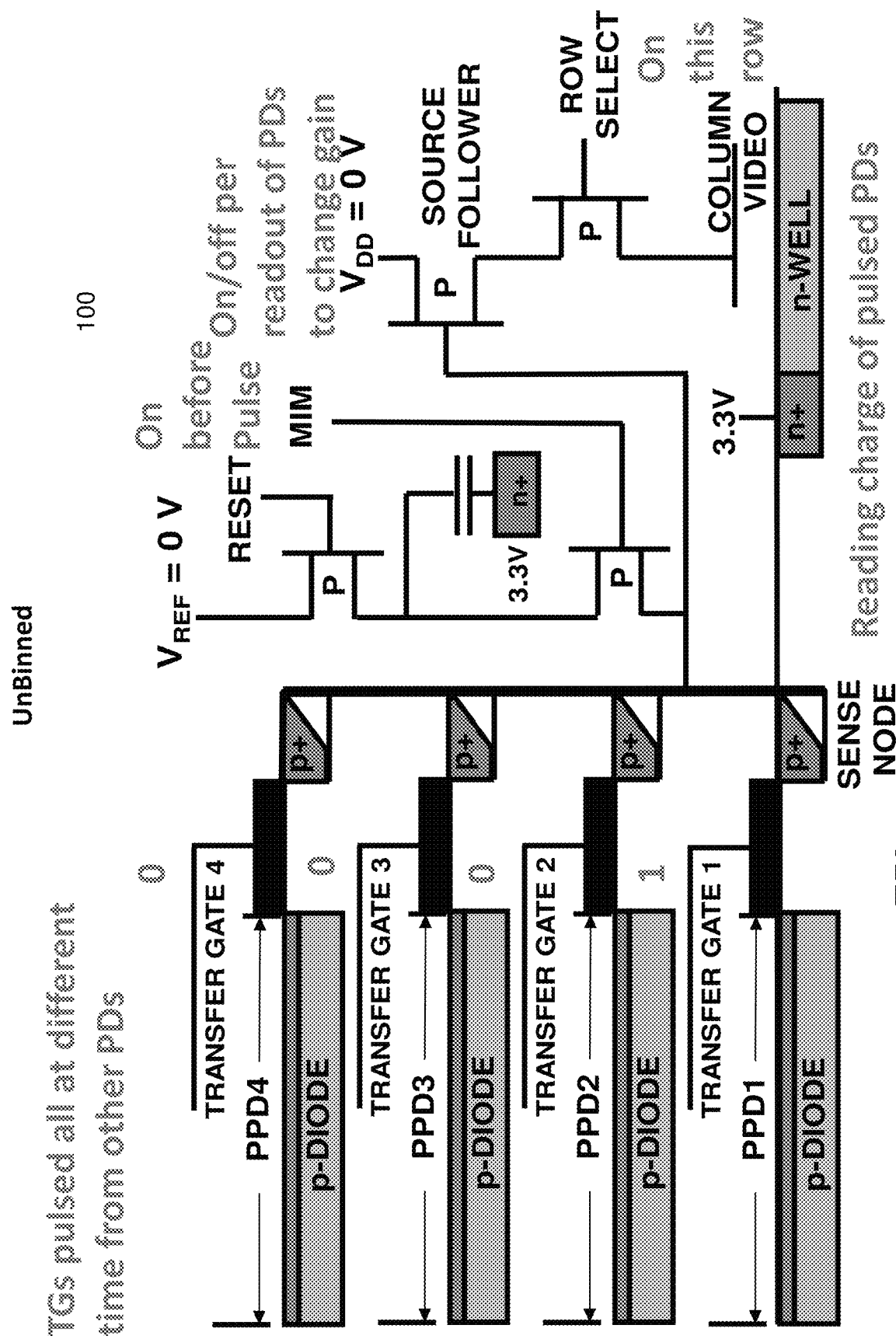
FIG. 10 illustrates an embodiment of a block diagram of a pixel in an unbinned imaging-mode of operation.

FIG. 10 illustrates an embodiment of a block diagram of a pixel in an unbinned imaging-mode of operation. In this example, each of the TGs for the four photodiodes is pulsed all at different times from other photodiodes. In this example, the transfer gate 1 for photodiode 1 is receiving a control signal of a logical 1 to have its charge to be sensed at the sense node and is read out. Transfer gates 2-4 also receive a control signal of a logical 0, so their corresponding photodiodes are electrically cut off from the sense node at this point in time and are accumulating charge. The control signal to the gate for the MIM gain capacitor can connect or disconnect the gain capacitor to the sense node on each photodiode readout in this pixel 100. Note, the control signal for the gate for the Row select would also be a logical 1 so that this pixel 100 in this row will have its charge for photodiode 1 read out.

Figure 11:
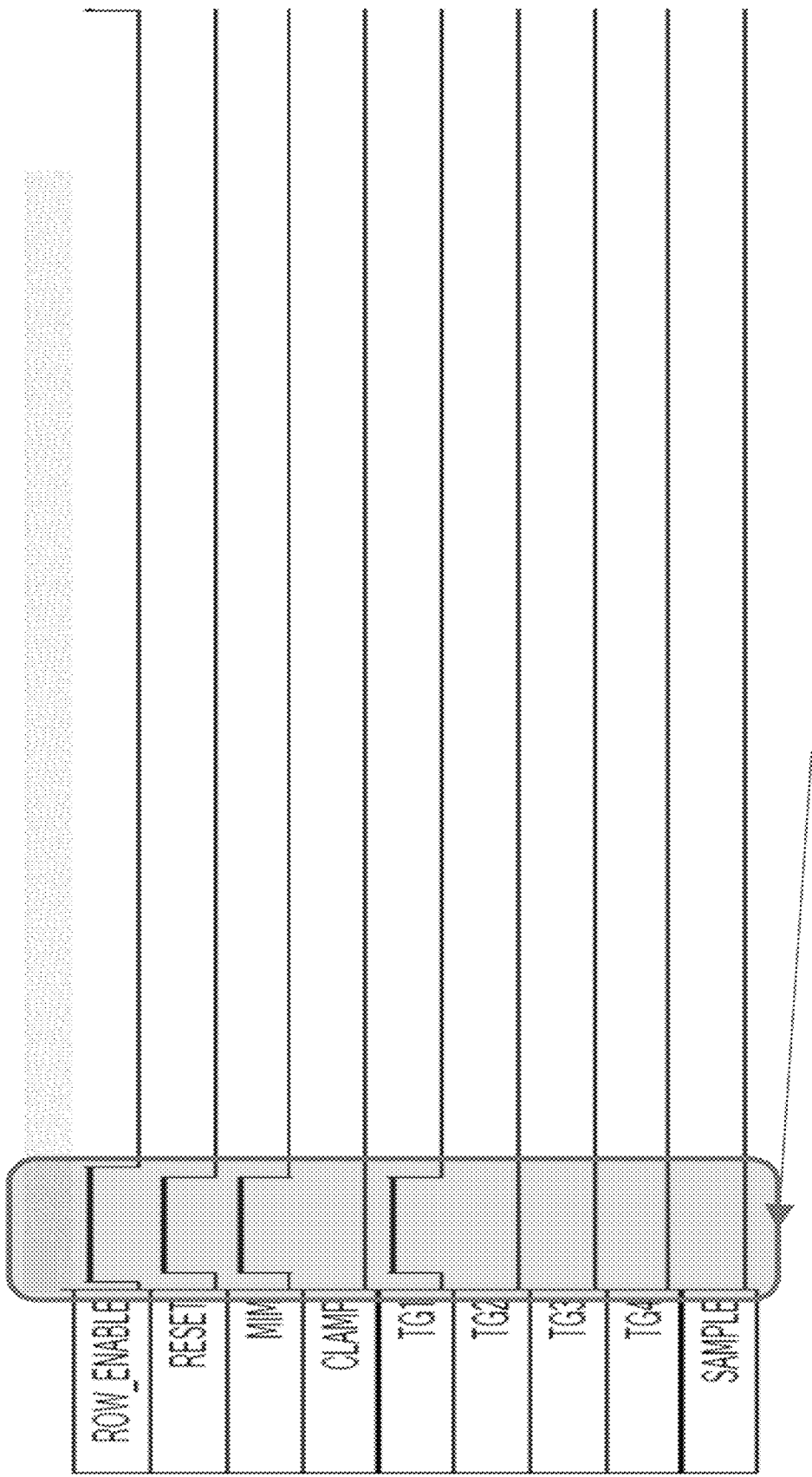
FIG. 11 illustrates an embodiment of a timing diagram of the control system operating a single pixel reset.

FIG. 11 illustrates an embodiment of a timing diagram 1100 of the control system operating a single pixel reset. This is how the controller controls exposure. Both photodiode #1 and the Sense Node have their charge removed. In this example photodiode 1 is being reset to have its charge dumped so it can then start accumulating charge when its integration control signal is sent such as shown in FIG. 10. Note, the gates for the RESET, MIM capacitor, and TG1 switches are all on at the same time and the TG2, 3 and 4 are off. The end result is photodiode 1 is ready to start of integration for Pixel #1.

Figure 12:
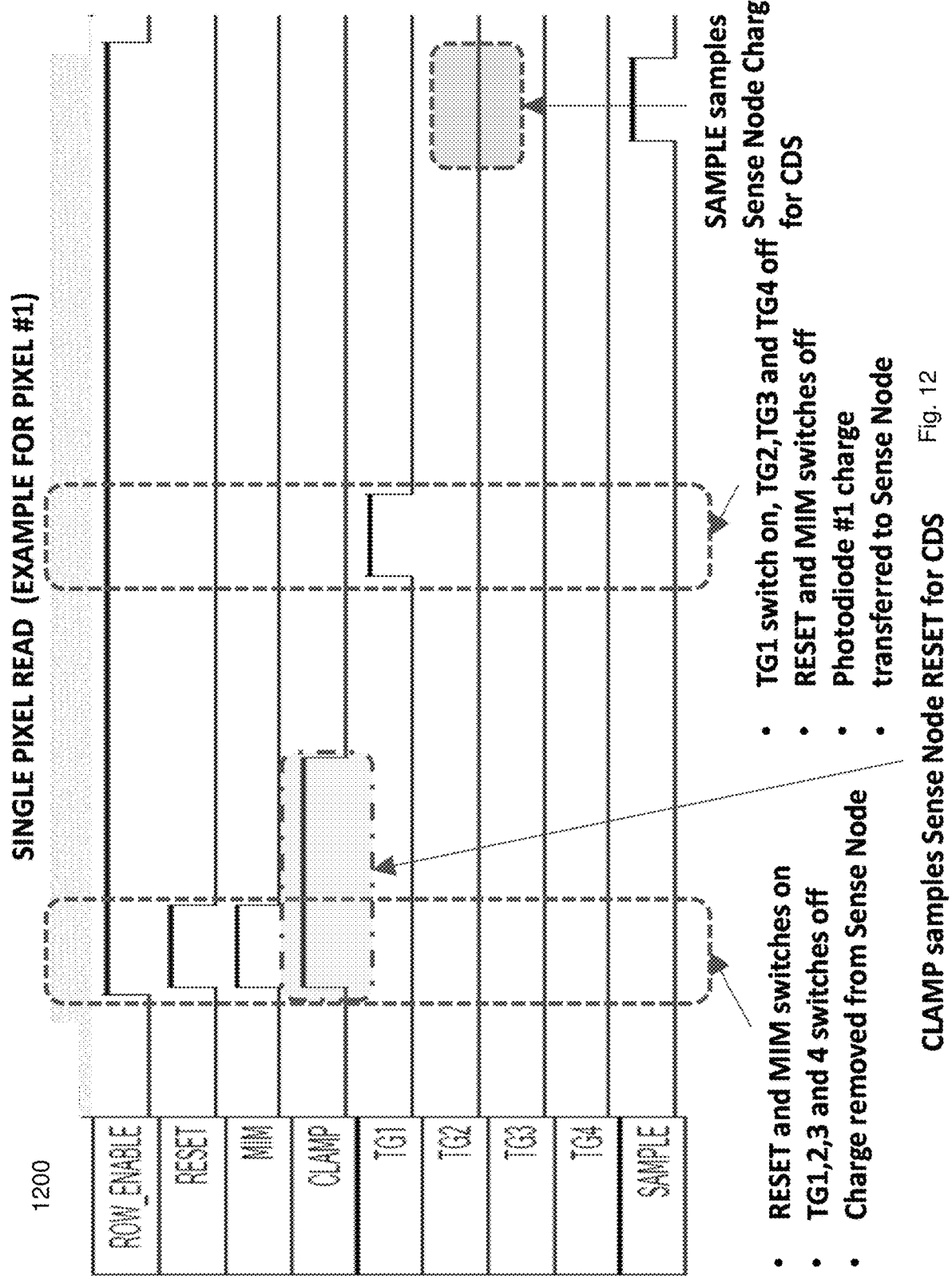
FIG. 12 illustrates an embodiment of a block diagram of a timing diagram of the control system operating a single pixel read out.

FIG. 12 illustrates an embodiment of a block diagram of a timing diagram 1200 of the control system operating a single pixel read out. In this example, the unbinned pixels, pixel 1 is being read out.

At a first step at time 1, the controller and timer send control signals to turn on the gates of the RESET switch and MIM capacitor. The controller and timer also send control signals to turn off the transfer gates TG1, TG2, TG3, and TG4 of the photodiodes to off. Each photodiode now accumulates charge. The controller and timer send control signals to have charge removed from the Sense Node.

At a first step at time 1 and extending into time 2, the controller and timer send control signals to clamp samples for the Sense Node RESET.

At a second step at time 3, the controller and timer send control signals to the transfer gate TG1 for photodiode 1 to switch to on. The control signals to the transfer gates TG2-TG4 for photodiodes 2-4 are maintain to keep these transfer gates TG2-TG4 off. The control signals to the RESET switch and gate for the MIM capacitor is maintained off. The accumulated charge for photodiode #1 is connected and sensed at the Sense Node. That sensed charge is readout without the gain capacitor altering the gain for that charge being read.

At a third step at time 4, the controller and timer send control signals to sample the charge at the sense node for a readout.

Figure 13:
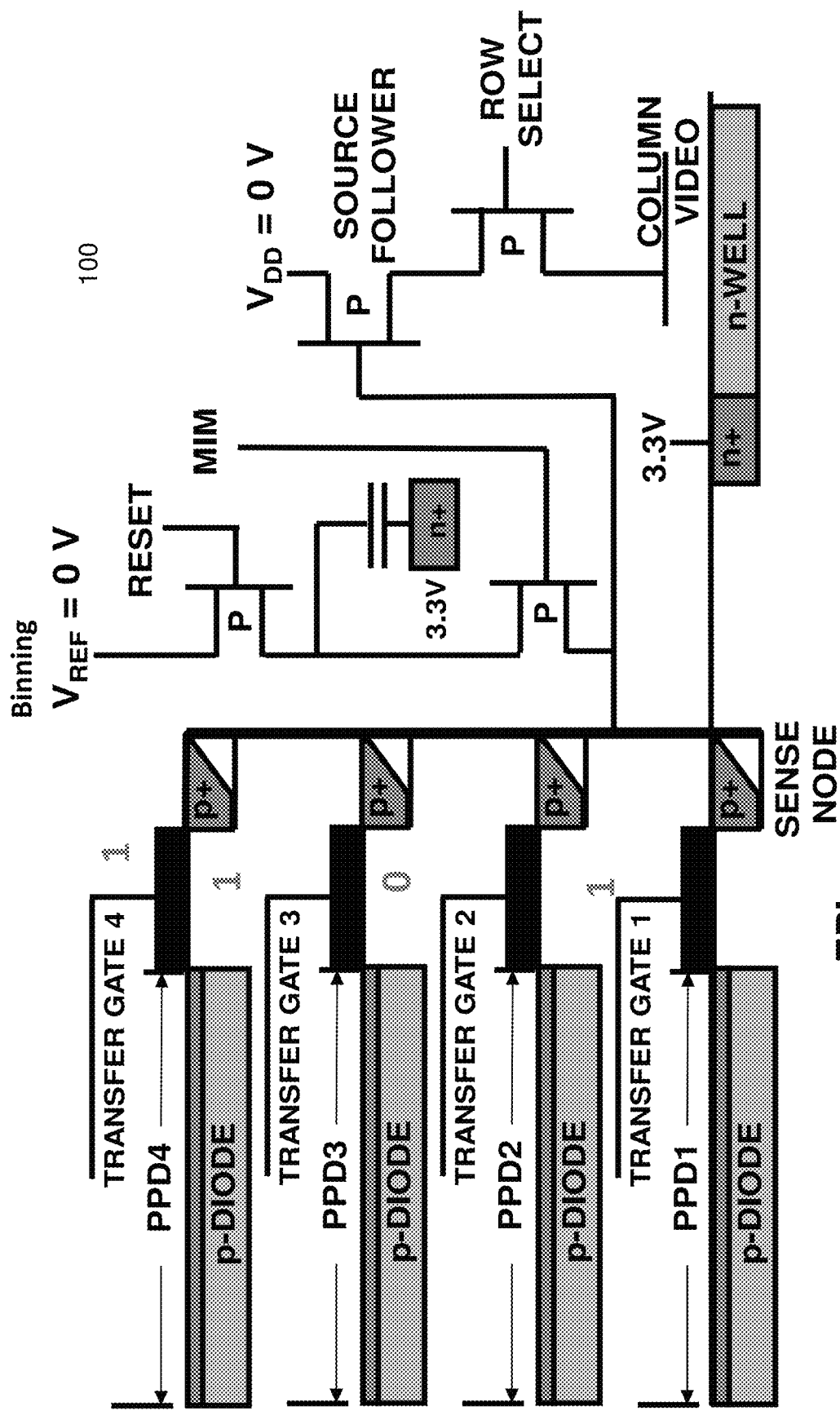
FIG. 13 illustrates an embodiment of a block diagram of an example pixel circuit in a binned imaging-mode of operation.

FIG. 13 illustrates an embodiment of a block diagram of an example pixel circuit in a binned imaging-mode of operation.

The control system uses the controller cooperating with a timer to send control signals to bin together any combination of two or more photodiodes to collect and read out accumulated charge, at a same time, from the photodiodes binned together. Note, the controller cooperates with the timer to pulse gates of all of the photodiodes binned together at a same time with its other binned photodiodes while a remaining amount of photodiodes in the individual pixel 100 have their control signals sent at a different time from the photodiodes binned together. Also in general, photodiodes diagonally aligned as fabricated in the pixel 100, e.g. PDs 1 & 3 or PDs 2 & 4 (see FIG. 2 and FIG. 4) in the individual pixel 100 are binned together first. Then a third photodiode not diagonally aligned could also be included in the binned photodiodes if three photodiodes where being binned together.

The combination of binned and unbinned photodiodes can be used in, for example, an extended dynamic-range imaging-mode of operation. The control system uses the controller and the timer to cooperate to place a pixel 100 in the row into the extended dynamic-range imaging-mode of operation while the controller and timer send control signals to another pixel in the same row to operate in a different imaging-mode of operation, such as an unbinned photodiodes or all photodiodes binned mode of operation. When in an extended dynamic-range imaging-mode, the controller and the timer cooperate to send control signals to the photodiodes in the pixel 100 such that at least two of the photodiodes are binned together. However, at least another photodiode in the pixel 100 has a different integration time than the binned photodiodes in the individual pixel 100. This way the photodiodes in the pixel 100 will capture charge with different integration times and capture different imaging conditions. The control circuitry can use the readout of the given photodiode or set of binned photodiodes that captures the best imaging conditions for the content, such as bright light, low light, fast moving object, etc.

In addition, per readout of charge, from any of the binned photodiodes or unbinned photodiodes in the pixel 100, the controller has an option of adding in or removing the gain capacitor from the sense node during that readout. Thus, the gate of the MIM gain capacitor can be pulsed either On (logical 1) or Off (logical 0) depending on if gain is needed for low lighting conditions captured by that photodiode being read out.

Figure 14:
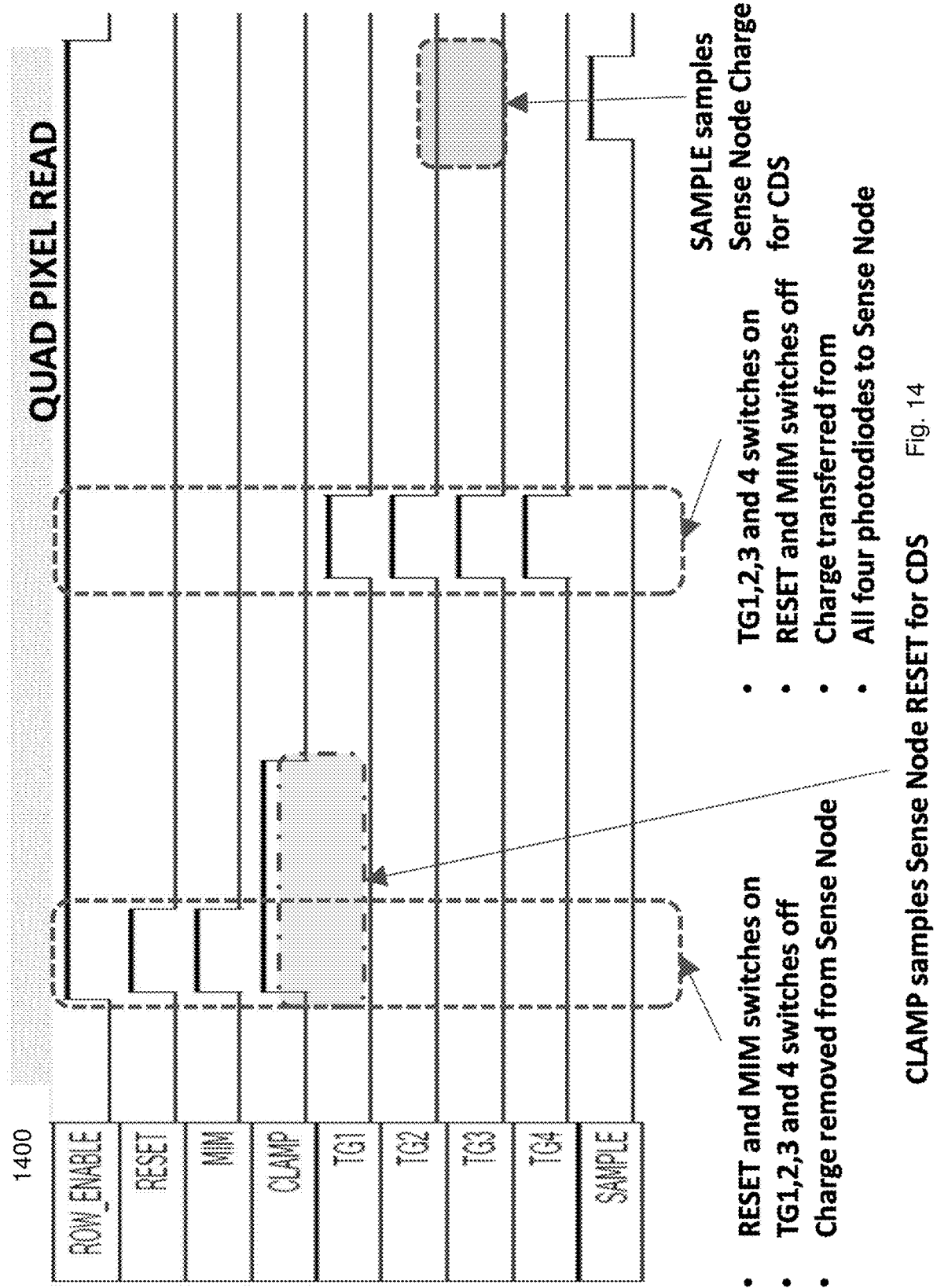
FIG. 14 illustrates an embodiment of a block diagram of a timing diagram of the control system operating four pixels binned together and read out.

FIG. 14 illustrates an embodiment of a block diagram of a timing diagram 1400 of the control system operating four pixels binned together and read out. In this example, the binned photodiodes, photodiodes 1-4 are being read together in one read cycle.

At a first step at time 1, the controller and timer send control signals to turn on the gates of the RESET switch and MIM capacitor. The controller and timer also send control signals to turn off the transfer gates TG1, TG2, TG3, and TG4 of the photodiodes to off. Each photodiode now accumulates charge. The controller and timer send control signals to have charge removed from the Sense Node. Note, the controller and the timer cooperate to start off the sequence by selecting and pulsing the Row switch slightly before pulsing any of the other components in that pixel 100.

At a first step at time 1 and extending into time 2, the controller and timer send control signals to clamp samples for the Sense Node RESET.

At a second step at time 3, the controller and timer send control signals to the transfer gates TG1-TG4 for binned photodiodes 1-4 to switch to on. The control signals to the RESET switch and gate for the MIM capacitor is maintained off. The accumulated charge for photodiodes 1-4 are all connected and sensed (binned) at the Sense Node. That sensed combined charge is readout without the gain capacitor altering the gain for that charge being read. The controller and the timer cooperate to bin all four photodiodes in this example to achieve the highest sensitivity.

At a third step at time 4, the controller and timer send control signals to sample the charge at the sense node for a readout.

Figure 15:
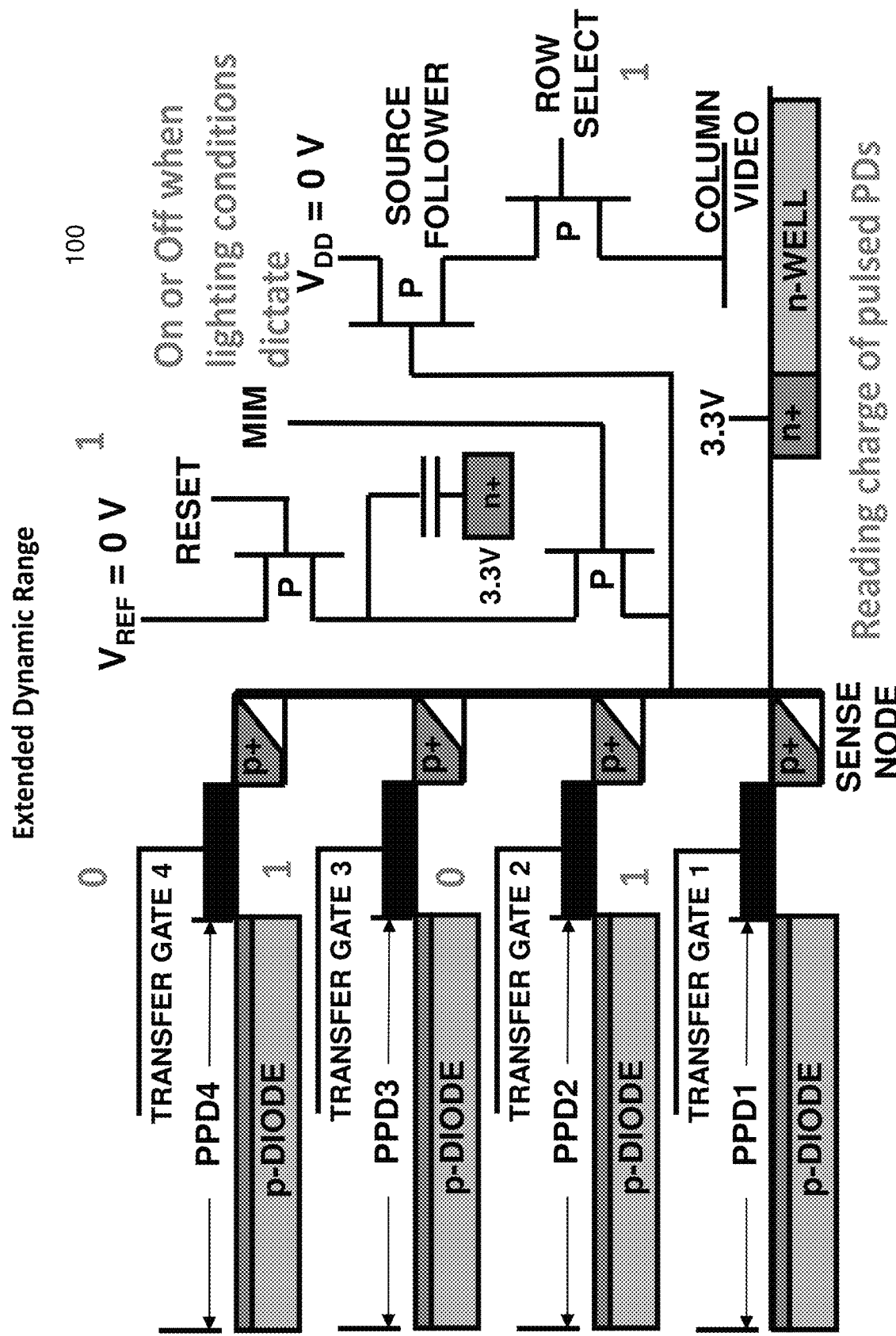
FIG. 15 illustrates an embodiment of a block diagram of an example pixel circuit in an extended dynamic range imaging-mode of operation.

FIG. 15 illustrates an embodiment of a block diagram of an example pixel circuit in an extended dynamic range imaging-mode of operation.

The controller and timer cooperate to place a pixel 100 into an extended dynamic range imaging-mode of operation.

The multiple pixels, all having a same architecture, in the image sensor can be used to implement a high dynamic range for this image sensor with a same set of pixels via use of binning of some photodiodes, unbinning of other photodiodes, controlling a length of integration time for the binned and unbinned photodiodes, and optionally bringing in the capacitance at the sense node.

In this example photodiodes 1 and 3 are binned together. The multiple pixels all have a same architecture, such as the example architecture in FIG. 15, but each pixel's internal photodiodes are configured to capture different amounts of integration time and potentially add a capacitive gain or not, with each read out, in this single pixel 100 in a time of one frame. The controller analyzing the scene can decide which readout of the pixels during that frame achieves the optimal image quality for that pixel 100.

Again, the controller and timer cooperate to allow control of each pixel 100 and each pixel's photodiodes on an individual basis for each row making up the image sensor. Thus, pixels even within a row of pixels making up a window/region of the entire image sensor can operate in a very diverse manner through the addition of a layer used almost exclusively for generation and routing the control signal traces, and then adding enough logic and circuits into the controller and timer to scale to handle controlling components in each pixel 100 on an individual basis from other pixels neighboring that pixel 100. What this design allows is controlling individual subframes within a pixel 100 and having multiple pixels operating simultaneously in different control modes, such as high frame rate, high dynamic range, etc. per row of pixels to allow a full field of vision image for an entire image while being able to control individual pixels within that full field of vision of the image captured by the image sensor to eliminate shadows by having pixels recording low light conditions to operate in a binned mode, to minimize oversaturation of pixels recording bright light conditions to operate in low gain mode, and pixels when recording moving objects to operate in a high frame rate mode and/or short integration time to eliminate blur, while other pixels operate in an extended dynamic range mode to capture the rest of the lighting and image conditions in this full field of vision of the image.

Each window region of the image can have an optimum image capturing via pixels in that region.

In an example, a pixel 100 may operate in a dynamic range mode in a first window while a neighboring pixel operates in another mode such as a high frame rate in a second window. The control system uses the controller and the timer to cooperate to enable an extended dynamic range imaging-mode of operation via i) having two or more pixels in the row operate in a binned imaging-mode of operation to capture charge from these pixels in the row that are in low light conditions in a first window while ii) having one or more pixels in the row operate with a short integration time and a gain capacitor connected to a sense node for a low gain to capture charge from these pixels in the image that are in bright light conditions without oversaturating in a second window, as well as iii) having other pixels in that row in a third window operate in a high frame rate imaging-mode of operation to eliminate blur in these pixels when recording moving objects in that pixel 100 to capture an entirety of the image.

FIG. 16 illustrates an embodiment of timing diagram 1600 of the control system conducting an extended dynamic range exposure timing sequence for the integration times for the four example photodiodes.

At time T0, the controller and timer coordinate to send a reset for photodiodes 1 and 3 to dump their charge and start their integration time. The controller and timer coordinate the bin the timings for photodiodes 1 and 3 to have a longest amount of integration time to acquire charge for a high sensitivity such as low light conditions.

At time TJ, the controller and timer coordinate to send a reset for photodiode 2 to dump its charge and start its integration time. The controller and timer coordinate for photodiode 2 to have an intermediate amount of integration time to be read out at the sense node.

At time TK, the controller and timer coordinate to send a reset for photodiode 4 to dump their charge and start their integration time. The controller and timer coordinate for photodiode 4 to have a shortest amount of integration time to connect the MIM capacitor to the sense node in order to have low gain to acquire signal level without saturation.

Combined, the operation of photodiodes 1-4 gives this pixel 100 an extended dynamic range of operation for many imaging conditions.

Figure 17:
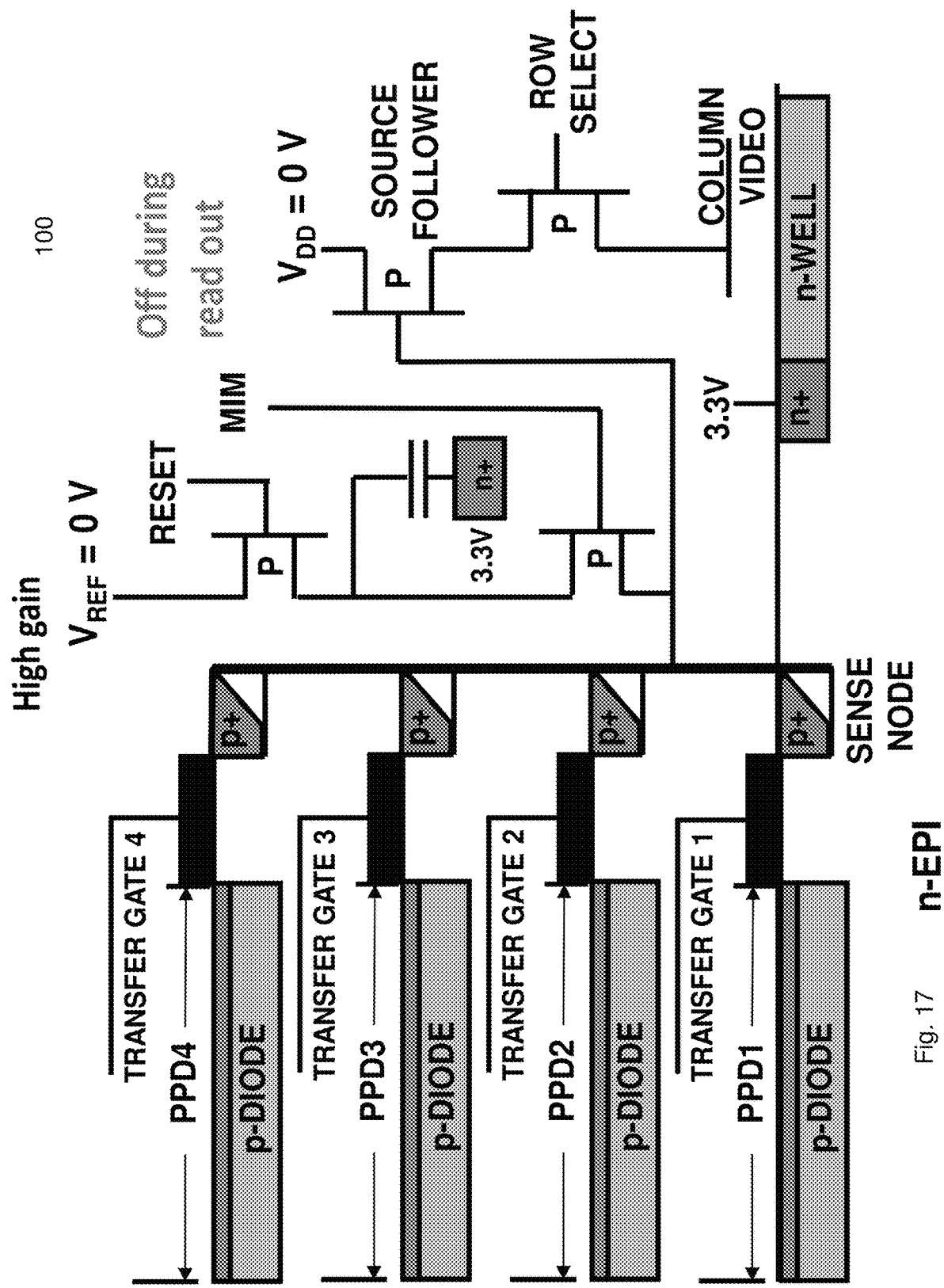
FIG. 17 illustrates an embodiment of a block diagram of a circuit making up a pixel in a given imaging-mode of operation with a high gain.

FIG. 17 illustrates an embodiment of a block diagram of a circuit making up a pixel in a given imaging-mode of operation with a high gain. The photodiodes can be in any operating state. When the unbinned or binned photodiodes are being read at the sense node, then the controller and timer can increase the gain on/amplify the measured accumulate charge being read out. The controller and timers send control signal to keep the gate for the MIM capacitor off during a read out. Thus, when the MIM capacitor is not connected, the sense node has a much lower capacitance and can achieve high conversion gain to achieve lower readout noise.

Figure 18:
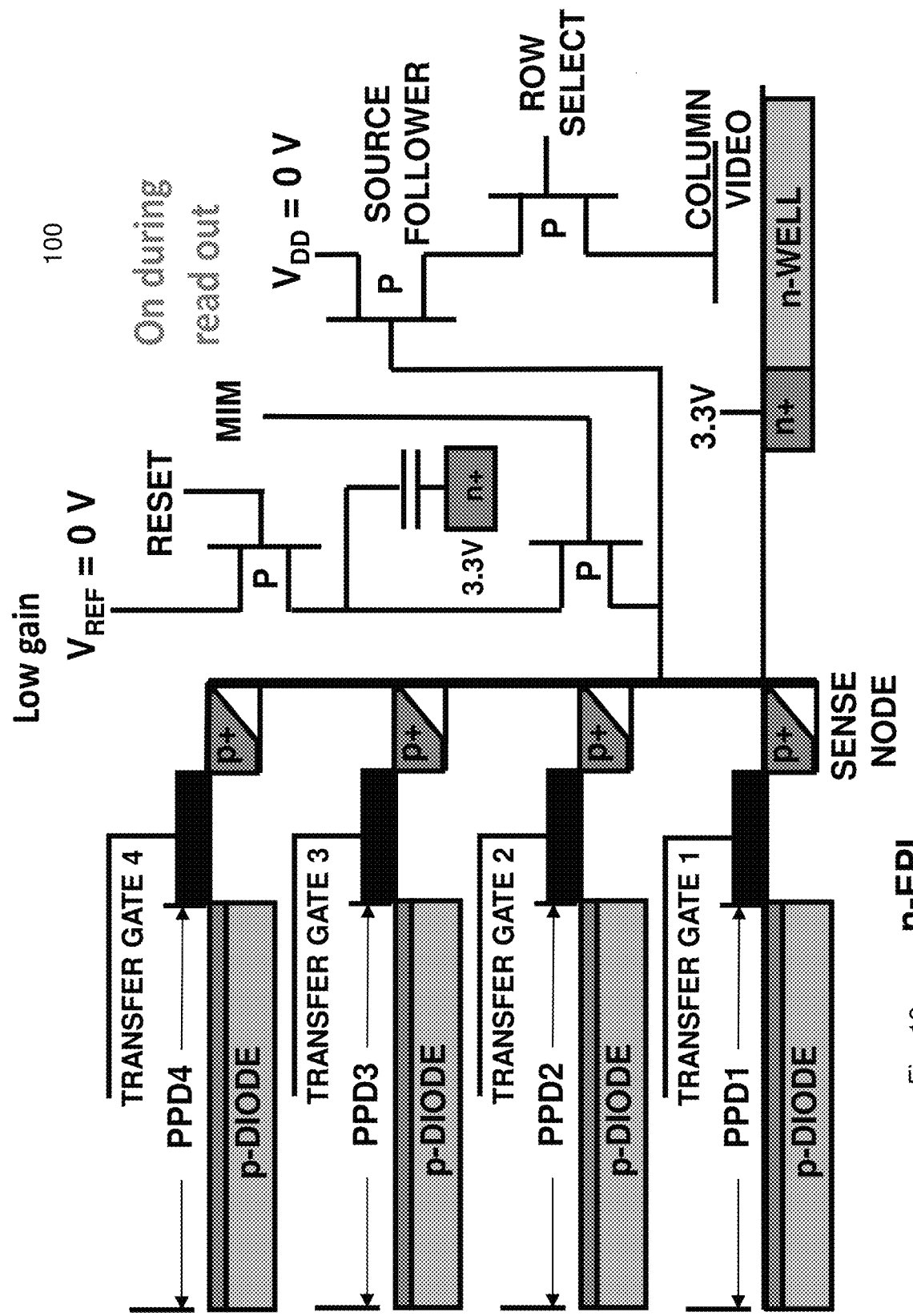
FIG. 18 illustrates an embodiment of a block diagram of a pixel circuit in a given imaging-mode of operation with a low gain.

FIG. 18 illustrates an embodiment of a block diagram of a pixel circuit in a given imaging-mode of operation with a low gain. Again, the photodiodes can be in any operating state. When the unbinned or binned photodiodes are being read at the sense node, then the controller and timer can pulse the gate for the gain capacitor to connect to the sense node when the photodiode's accumulated charge is being read out. The gain from this connection remains low.

Figure 19:
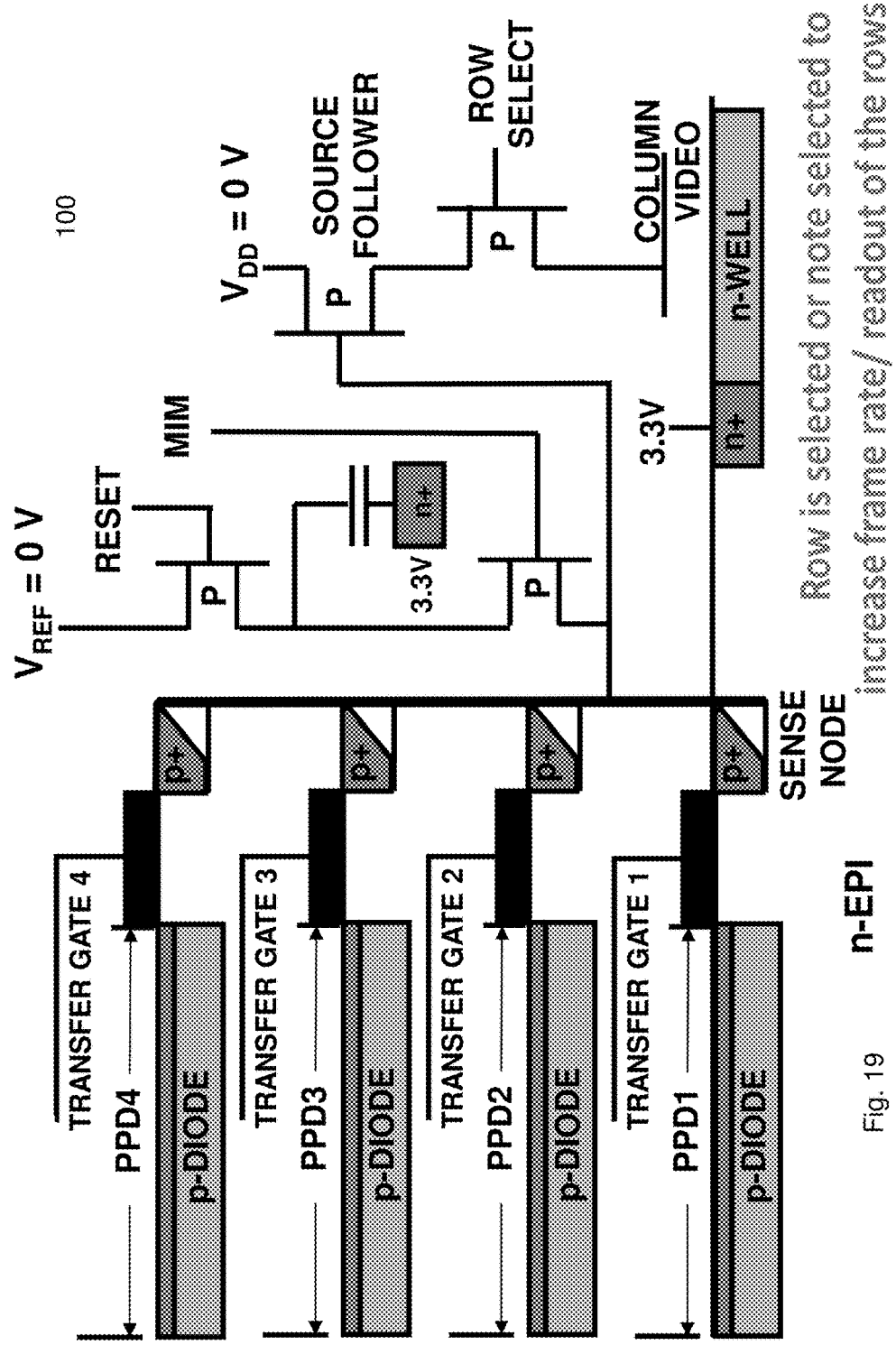
FIG. 19 illustrates an embodiment of a block diagram of an example pixel in a high frame rate imaging-mode of operation.

FIG. 19 illustrates an embodiment of a block diagram of an example pixel in a high frame rate imaging-mode of operation.

A high frame rate for motion adaptive signal integration (MASI) can be an imaging-mode of operation using a readout of photodiodes from a pixel 100 with multiple photodiodes. The high frame rate MASI algorithm, achieves a high dynamic range by combining high frame rate images of varying exposures. The high frame rate mode can still implement binning, unbinning, and extended dynamic range in a given pixel 100. Note, a high frame rate could also cut out a certain amount of rows or even individual pixels from being read to match a data throughput of the image sensor.

In an example, the controller and timer cooperate to send control signals to enable a row, such as a first row, in the first window to operate in an extended dynamic range imaging-mode of operation while another row in the second window operates in a high frame rate imaging-mode of operation based on sensed imaging conditions in the first row and imaging conditions in the second row.

As discussed, in some cases, possibly this entire row or just some of the pixels in this row are not selected to be read in order to increase a frame rate/readout of the rows of pixels making up an entire image.

If this row is selected to be read in an increased frame rate mode then the photodiodes can be binned or unbinned.

The control system can use two or more decoders cooperating with a timer to direct control signals to one or more rows in the window to operate in a high frame rate imaging-mode of operation while a first pixel in the row operates with two or more photodiodes binned together, with a second pixel in the row operates with all of its photodiodes unbinned based on sensed imaging conditions in the first pixel and imaging conditions in the second pixel.

Example Image Sensor with a Wide Dynamic Range

An imaging system for capturing light that extend over a wide dynamic range and method for operating the same are provided. The imaging sensor includes a plurality of pixels. Each pixel includes a substrate; two or more photodiodes formed in the substrate that are coupled to a sense node, each photodiode having connected thereto a different transfer gate for selectively controlling a charge accumulation therein due to an incident light; and a gain capacitor.

In some aspects, the system and method include positioning a pixel to image a scene described by light signals that extend over a wide dynamic range, and selecting a different integration time for at least two photodiodes in the pixel based on light signals received by the pixel. The photodiodes are coupled to a sense node, and each photodiode is controlled using a different transfer gate.

The method also includes performing a readout of the pixel using a readout circuit connected to the sense node. A capacitance associated with the sense node is modified during the readout of the at least two photodiodes. The capacitance associated with the sense node can be modified by selectively connecting a gain capacitor to the sense node.

The gain capacitor selectively connects to the sense node and readout circuitry for measuring the charge accumulation. The readout circuitry connects to the sense node and includes a reset transistor, a source follower transistor, and a row select transistor.

A controller is configured to operate the imaging sensor by:

selecting a different integration time for at least two photodiodes in a pixel based on light signals received by the pixel;

performing a readout of the pixel, wherein a capacitance associated with the sense node is modified during the readout of the at least two photodiodes; and assembling an image using signals obtained from the plurality of pixels in the readout.

The two or more photodiodes may include p-type diodes. The size of each pixel can be in a range approximately between 1 and 20 μm. The charge accumulated in two or more photodiodes of the pixel can be combined.

The gain capacitor may include a metal insulator metal ("MIM") capacitor. The capacitance associated with the sense node can be modified based upon a dynamically determined dynamic range of the scene. The capacitance is in a range approximately between 1 off/μm2 and 10 fF/μm2.

The different integration times are selected for two or more photodiodes in the pixel to achieve the wide dynamic range for the pixel. The wide dynamic range can be up to approximately 10,000,000:1. The integration time of one or more of the at least two photodiodes can be selected based on information from a previous image frame. The integration time can be in a range approximately between 1 ms and 1 sec.

The advantages of CMOS imagers over CCD imagers are that CMOS imagers have a low voltage operation and low power consumption. Also, CMOS imagers are compatible with integrated on-chip electronics (control logic and timing, image processing, and signal conditioning such as A/D conversion). In addition, CMOS imagers allow random access to the image data. On-chip integration of electronics is particularly advantageous because of the potential to perform many signal conditioning functions in the digital domain (versus analog signal processing) as well as to achieve a reduction in system size and cost.

Appreciable intra-scene light intensity variation poses a significant technical problem for current imaging technologies, resulting in overexposed or underexposed regions that reduce image quality. Although some approaches have aimed at addressing this issue by acquiring multiple image frames with different exposure times, such multiple exposure approach can introduce artifacts due rapid changes in scenery between frames, thus reducing image resolution and quality. Other approaches have utilized pixel redundancy or introduced additional components that have undesirable cost and limited resolution and sensitivity.

Therefore, the present disclosure provides a novel imaging approach using an imaging sensor capable of capturing images under various lighting conditions. Specifically, using a multi-photodetector pixel configuration designed to achieve multiple integration times, high and low gain, and charge binning, the herein provided imaging sensor can provide a wide or extended dynamic range, particularly within single image frames. As may be appreciated, the present disclosure can provide technological advancement for a broad range of applications, including commercial and military surveillance, medical imaging, machine vision, autonomic vehicle imaging, to name a few. In particular, the present disclosure can improve imaging for scenery that includes regions with high and low signal outputs.

Figure 1:
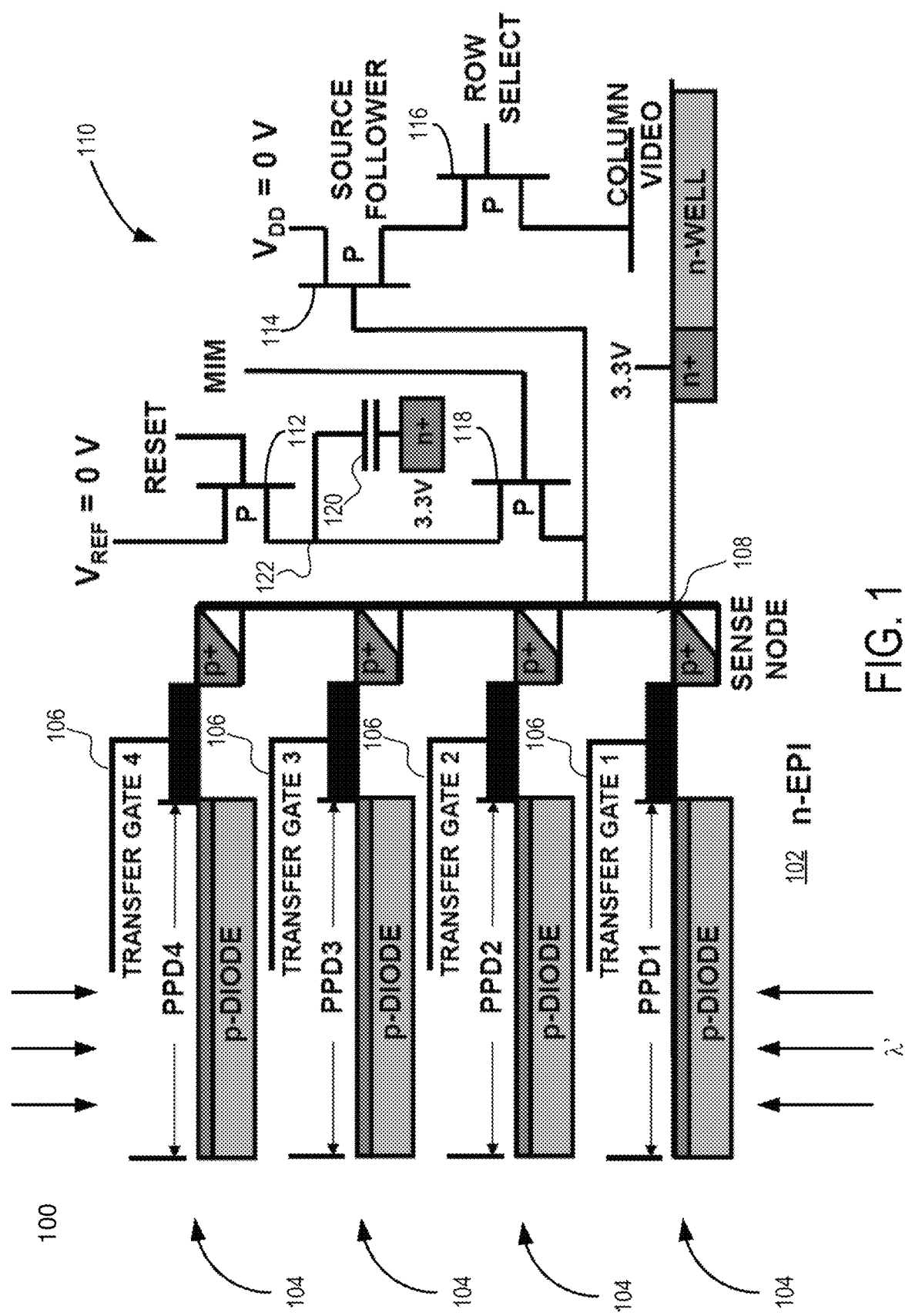
FIG. 1 illustrates an embodiment of an example circuit schematic of a CMOS pixel.

In accordance with one embodiment of the present disclosure, a pixel 100 having a possible Extended Dynamic Range is shown in FIG. 1. The pixel 100 includes a substrate 102 and four pinned photodiodes 104 formed in the substrate 102, wherein the photodiodes 104 are configured to integrate charge generated due to incident light. As shown in FIG. 1, the light may be directed from the front, or top side of the pixel 100, as indicated by Δ, or the back, or bottom side, as indicated by λ', or at any angles there between. Herein, the incident light A may include ambient or scenery lighting described by a panchromatic spectral range. In particular, the panchromatic spectral range may include wavelengths in the visible portion, the near infra-red portion and ultraviolet portion of the spectrum. As such, active photosensitive areas of the pinned photodiodes 104 may be responsive to the panchromatic spectral range. In some embodiments, active areas of the pinned photodiodes 104 may be responsive to a sub-band of the panchromatic spectral range, as described in co-pending, commonly owned, U.S. patent application Ser. No. 14/796,265, filed Jul. 10, 2015, the disclosure of which is incorporated herein by reference in its entirety. To this end, the pixel 100 may include a filter separating the sub-band (i.e. a color filter). Furthermore, the active areas of the pinned photodiodes 104 may be responsive to a particular polarization. The pixel 100 may include a filter (i.e. a polarization filter) for polarizing the incident light. By way of example, the size of the pixel can be in a range approximately between about 1 and about 20 μm, although other values may be possible.

Each of the pinned photodiodes 104 is connected to a different transfer gate 106 in a configuration that allows independent control of charge accumulation for each of the pinned photodiodes 104. That is, different integration times may be dynamically selected for two or more of the pinned photodiodes 104 to achieve a wide dynamic range for the pixel 100. In some aspects, integration times may be selected based on information from a previous image frame. By way of example, integration times can be in a range approximately between 1 ms and 1 sec, with a dynamic range of up to approximately 10,000,000:1, although other values may be possible.

The pinned photodiodes 104 are coupled to a common sense node 108, allowing for noiseless, charge domain binning. That is, using a single sense node 108 charge accumulated in each of the four pinned photodiodes 104 may be selectively combined. Although FIG. 1 shows four pinned photodiodes 104 as an example, it may be readily appreciated that fewer or more pinned photodiodes 104, each having a different transfer gate 106, may be included in the pixel 100. Preferably, the pixel 100 includes two or more photodiodes 104.

The pixel 100 also includes readout circuitry 110 connected to the sense node 108 that is configured for measuring the charge accumulation in the pinned photodiodes 104. As shown, the readout circuitry 110 includes a reset transistor 112, a source follower transistor 114 and a row select transistor 116. In addition, the readout circuitry 110 also includes a MIM transistor 118 (i.e., a MOSFET switch) and a gain capacitor 120. One terminal of the gain capacitor 120 is electrically connected to an intermediate node 122 between the reset transistor 112 and MIM transistor 118.

By way of example, a layout of a pixel is illustrated in FIG. 2. As shown, four pinned photodiodes ("PPDs") are depicted in a quad-pixel configuration, each with their associated transfer gates (i.e. TG 1, TG2, TG3, and TG4). The sense node is labeled in the center (SN) of FIG. 2. The four readout transistors labeled SF, ROW, MIM and RESET, refer to the source follower, row, metal-insulator-metal and reset transistors, respectively. As shown, the size of each PPD can be approximately 4 μm×4 μm.

Figure 3:
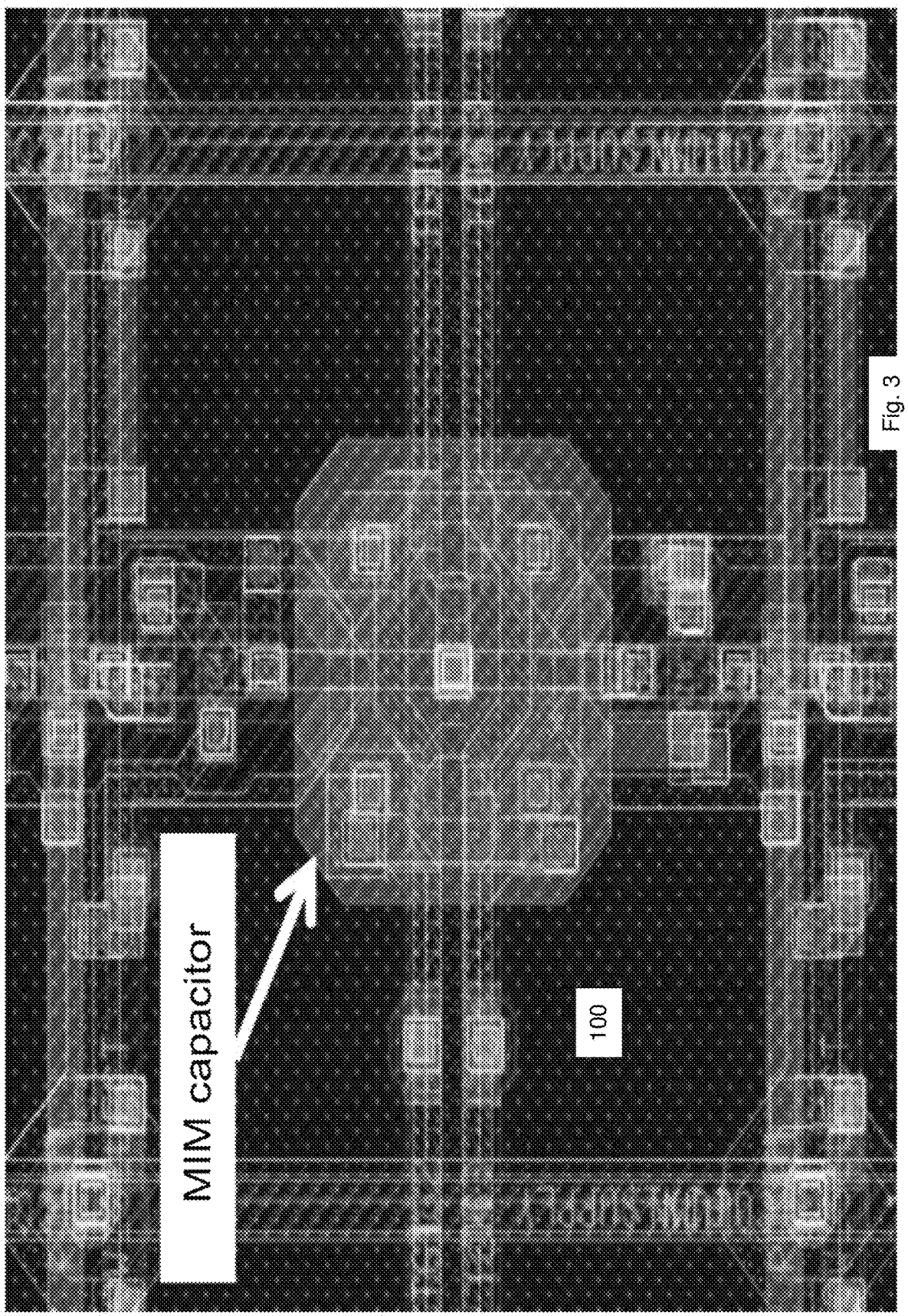
FIG. 3 illustrates an embodiment of a diagram of an example another CMOS pixel with a MIM gain capacitor.

Referring again to FIG. 1, the capacitance of the gain capacitor 120 can be selected based upon a predetermined dynamic range of the imaging sensor. For example, the capacitance may be in a range approximately between 1 $fF/\mu^{m2}$ and 10 $fF/\mu^{m2}$, although other values may be possible. In some implementations, the gain capacitor 120 may be a metal-insulator-metal capacitor, formed by a multi-level metal stack with dielectric thickness configured to achieve high capacitance per unit area as described in co-pending, commonly owned, U.S. patent application Ser. No. 13/169,242, filed Jun. 27, 2011, the disclosure of which is incorporated herein by reference in its entirety. By way of example, a layout of the quad-pixel configuration showing a metal-insulator-metal ("MIM") gain capacitor is illustrated in FIG. 3.

During operation of the pixel 100, the MIM transistor 118 may be used to select a high or low V/e– gain by selectively allowing the gain capacitor 120 to be connected to the sense node 118. In this manner, a wide dynamic range may be achieved. Specifically, when the gain capacitor 120 is connected to the sense node 108 after a reset operation, a low gain, higher saturation level can be achieved for the pixel 100. If the gain capacitor 120 is not connected, the sense node 108 has a much lower capacitance that allows a high conversion gain for a lower readout noise. The sense node 108 reset occurs when both reset transistor 112 and the MIM transistor 118 are activated. In some embodiments, the pixel 100 may also include capabilities for addressing blooming effects, which occur when charge capacity is exceeded and additional charges spill into neighboring pixels. For example, the pixel 100 may include a clamping circuit (not shown in FIG. 1), as well as other circuits or capabilities.

As shown in FIG. 1, the pixel 100 may be configured as a p-type CMOS pixel. That is, the pinned photodiodes 104 are based on p-type semiconductor materials. However, in another embodiment, the conductivity type of the pinned photodiodes 104, and other doped regions of the pixel 100 may be reversed to form a functioning n-type CMOS pixel. In an n-type pixel (otherwise known as an NMOS pixel), the carrier type is electrons, while in a p-type pixel (otherwise known as a PMOS pixel), the carrier type is holes. In some embodiments, the n-type or p-type pixels/imagers may be either front-illuminated or back-illuminated.

In some embodiments, an imaging system for imaging a scene described by light signals that extend over a wide dynamic range is provided. The imaging system may include an imaging sensor or imager that is formed using one or more arrays of pixels, as described with reference to FIG. 1. The imaging system may also include a controller for controlling the operation of the pixels in the imaging system. In particular, the controller may be configured to read out signals from each pixel using its associated source follower, reset and row select transistor, as described, each pixel producing a voltage signal on a column bus (which has a current source load). Readout of the pixels in the imaging sensor may be performed using a variety of techniques known in the art. For example, a rolling shutter integration technique may be performed by the controller. The controller may then be configured to assemble one or more image frames using the signals from multiple pixels in the imaging sensor.

In some aspects, the controller may be configured to analyze a scene, and based on scene content, such as regions of different light intensities, adapt the operation of different pixels in the imaging sensor for optimal sensitivity. For example, the controller may modify durations of exposure, integration times, and gain settings of individual pixels based on the light intensity information. In one implementation, the controller may be configured to select a different integration time for different photodiodes in a pixel based on light signals received by the pixel, and perform a readout of the pixel, where the capacitance associated with the sense node is modified during the readout to modify the gain. In particular, the capacitance may be modified based upon a predetermined dynamic range of the scene, or based on analyzed scene content. In one example, the controller may operate a quad-type pixel using 4 different integration times, read out from the shortest integration time to the longest, and at least one of the shorter times being operated with the capacitance, i.e. gain, being modified at least once. In another example, the controller may operate a quad-type pixel using 3 different integration times, two pixels having the same integration time and signals therefrom being binned together, with the gain being modified at least once during the readout. These are mere examples, and it may be readily appreciated that any combination of operational modes are possible.

In some aspects, different pixels in an imaging sensor may be responsive to different sub-bands of the panchromatic spectral range, as described. Therefore, the controller may be configured to operate respective pixels in the imaging sensor in accordance with the different sub-bands.

Figure 4:
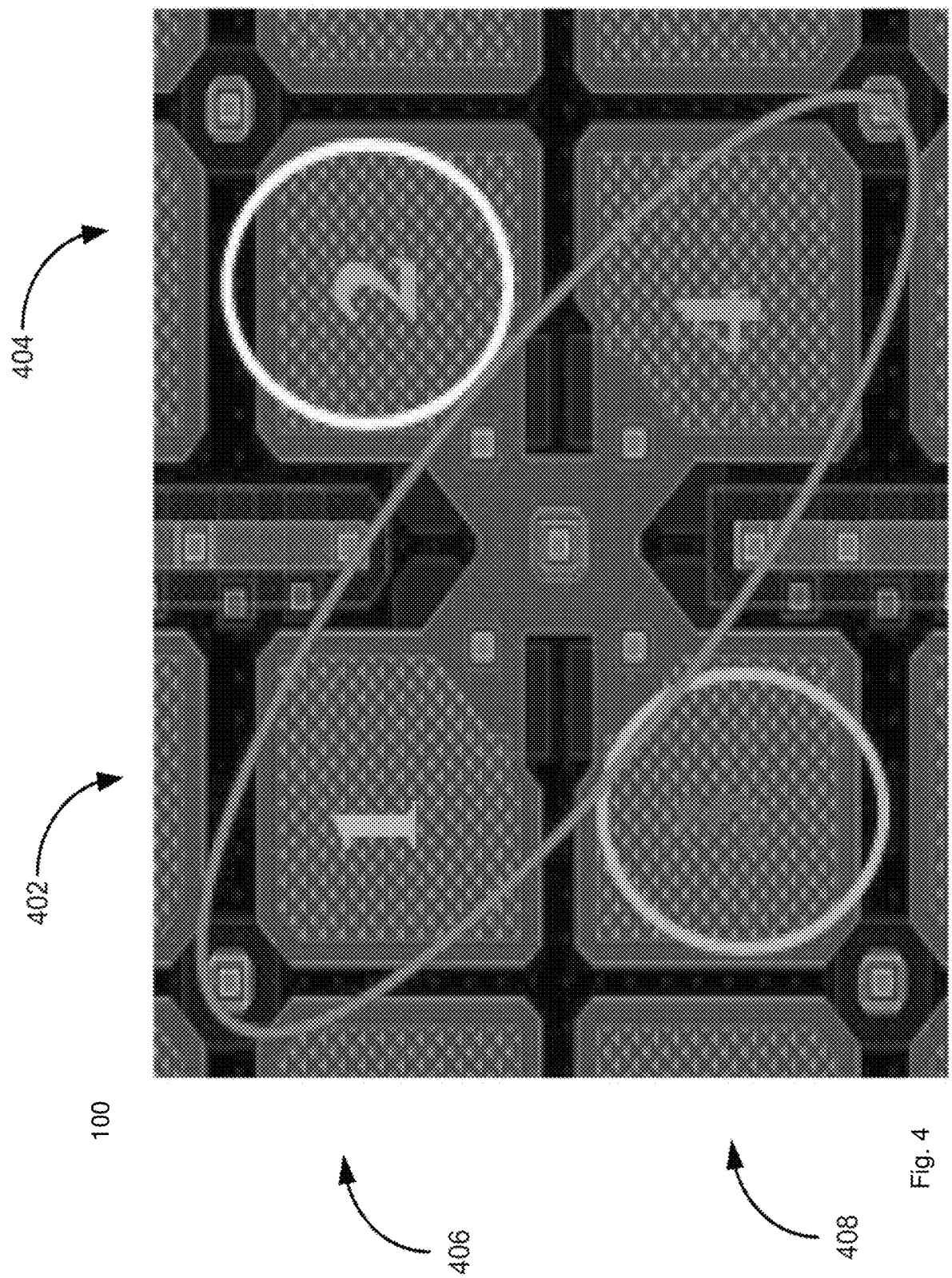
FIG. 4 illustrates an embodiment of a diagram of an example a CMOS pixel in a substrate.

Referring now specifically to FIG. 4, an image illustrating a mode of operation of a pixel 400 in a quad-pixel configuration, in accordance with aspects of the present disclosure, in shown. In particular, to achieve a wide dynamic range for single image frames, as described, the pixel 400 may be operated using three signal readouts, each having a different integration time, although other signal readouts may be possible. For instance, to capture the low-range imagery photodetectors "1" and "4", located on the left 402 of the top row 406 of the pixel 400 shown in FIG. 4, may be operated at the 4 fps integration time of 250 ms, for example, with high gain for highest SNR, and signals being binned together. To capture mid-range imagery photodetector "2", located on the right 404 of the top row 406 of the pixel 400, can integrate for 25 ms and be read out in low gain, for example. Furthermore, to capture the high-range imagery pixel "3", located on the left 402 of the bottom row 408 of the pixel 400, can integrate for 1.25 ms and be read out in low gain, for example. As described, gain may be controlled by selectively coupling a gain capacitor. In this manner, a 10,000,000:1 dynamic range may be obtained, for example, assuming a noise floor of 1 h+, a pinned photodiode saturation level of 50,000 h+ and the factor of 200× in integration time.

The three signal outputs can then be measured and the best signal or a combination of the signals may then be scaled by integration time and used for display and radiometric accuracy analysis. In some aspects, non-linearity and calibration of the signal chain for each pixel can be taken into consideration. One of ordinary skill would readily recognize that variations on the above mode of operation are also possible. For instance, long integration times can be greater than 250 ms and the shortest integration times can be the line time, which is typically less than 0.024 ms. Also, each photodetector may use a different integration time.

In the above-described mode of operation, handling the extremely wide dynamic range may tax the anti-blooming capability in the quad-pixel configuration. To address this concern, the shortest integration time signal may be read out first, followed by the middle integration time, and then the longest integration time. Furthermore, the transfer gates may be operated such that the pinned photodiodes can spill through the sense node to the reset drain before charge has a chance to spread to adjacent pixels.

Figure 5:
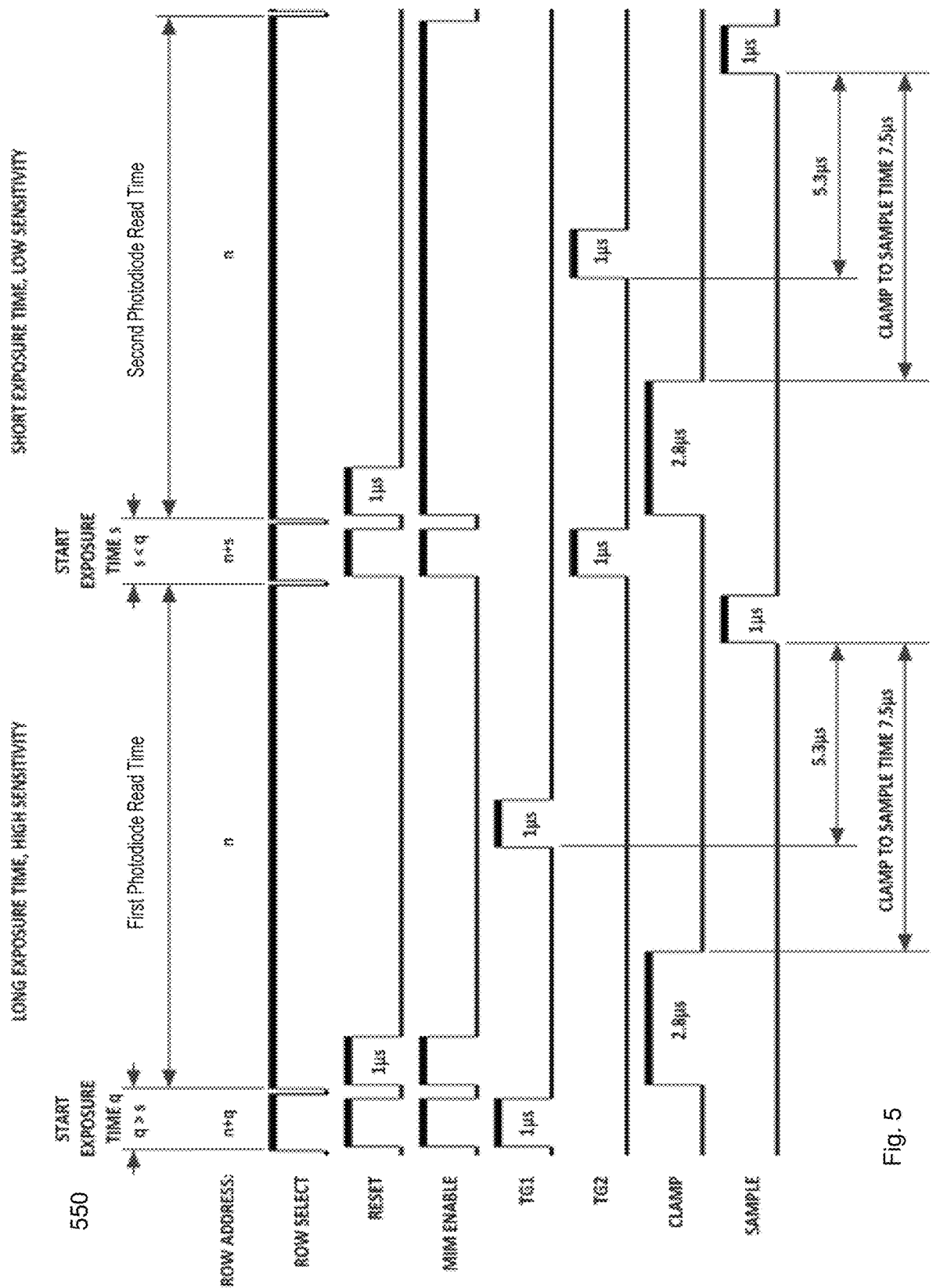
FIG. 5 illustrates an embodiment of a timing diagram of a mode of an operation of a CMOS pixel.

Referring now to FIG. 5, an example timing diagram 550 for a control system operating a pixel, in accordance with aspects of the present disclosure. Specifically, this example shows the operation of a pixel having two photodiodes in a row, both coupled to a sense node and having a separate charge transfer gate coupled thereto. The pixel also includes a gain capacitor selectively connectable to the sense node, as well as readout circuitry for measuring charge being accumulated in the photodiodes. In some implementations, the readout circuitry includes a reset transistor, a source follower transistor, a row select transistor, and a correlated double sampling (CDS) circuit. In particular, the CDS circuit may be located in proximity to the pixel or attached via a common signal line to a location outside of the imaging area of the pixel.

Referring specifically to FIG. 5, the timing diagram 550 shows the activation of a ROW SELECT, which chooses the row connected to a column signal line, a RESET, which resets the sense node diode voltage to a reference voltage, and a MIM ENABLE, which connects or disconnects a gain capacitor from the sense node. The timing diagram 550 also shows activation of a TG1, which is the charge transfer gate for the first photodiode, a TG2, which is the charge transfer gate for the second photodiode, a CLAMP, which activates the correlated double sampling circuit (CDS) to store the value of sense node zero signal voltage, and a SAMPLE, which activates the CDS circuit to store the signal voltage after charge is transferred to the sense node.

In operating the first photodiode, the exposure time is started by resetting the first photodiode charge to zero using the RESET. Specifically, the first integration time is started during the time period labeled START EXPOSURE TIME, q. During the readout time of the first photodiode, the MIM ENABLE is shown to be off, and as such the charge-to-voltage conversion is determined by the capacitance of the sense node. Although low noise is maintained, signal output saturation occurs at a relatively low signal level. Similarly, in operating the second photodiode, the exposure time is started by resetting the second photodiode charge to zero using the RESET. Specifically, the second integration time is started during the time period labeled START EXPOSURE TIME, s. During the readout time of the second photodiode, the MIM ENABLE is shown to be on. This connects the gain capacitor to the sense node, thus modifying the capacitance across the sense node. Connecting the gain capacitor changes the charge-to-voltage conversion value and enables a higher charge signal to be stored on the sense node.

In this example, the row time was selected to be approximately 24 µs to permit both photodetectors to be read out with a ADC conversion rate consistent with moderate rate column parallel ADCs. The clamp to sample time of 7.5 µs was selected to be consistent with dominant time constant being targeted for low noise pixels and analog signal processing. The row address n+k time slots was used to reset rows not being read out, to achieve sub-frame integration time. It may be readily appreciated that other timings may be possible.

As shown in FIG. 5, the integration time of the first photodiode was selected to be longer compared to the integration time of the second photodiode. This allows for an increased performance of the first photodiode at low light levels due to the longer exposure. On the other hand, a higher number of photons can illuminate the second photodiode before saturation, at the cost of degraded low light performance due to increased noise floor. However, by virtue of combining these into a single pixel, a wide range of light signals can be measured. That is, by using combining information from each of the photodiodes, a greater intra-scene dynamic range can achieved, spanning low and high light levels.

As described with reference to FIGS. 1-4, pixels in accordance with the present disclosure may include more than two photodiodes in various configurations, and signals produced therein may be readout out individually or in various combinations. As such, the example timing diagram 550 may be readily adapted to these variations. For example, in a quad-pixel configuration having four photodiodes, a different row of can be read out in a similar manner as described above, either using the same or a different combination of timing and gain operations.

The present invention has been described in terms of one or more embodiments, and it should be appreciated that many equivalents, alternatives, variations, and modifications, aside from those expressly stated, are possible and within the scope of the invention.

Additional Examples

Illustrative examples of the technologies disclosed herein are provided below. An embodiment of the technologies may include any one or more, and any combination of, the examples described below.

In an example 1, a system for imaging a scene described by light signals that extend over a wide dynamic range is provided. The system includes an imaging sensor comprising a plurality of pixels, each pixel comprising a substrate, two or more photodiodes formed in the substrate that are coupled to a sense node, each photodiode having connected thereto a different transfer gate for selectively controlling a charge accumulation therein due to an incident light, a gain capacitor selectively connectable to the sense node, and readout circuitry for measuring the charge accumulation, the readout circuitry being connected to the sense node and comprising a reset transistor, a source follower transistor, and a row select transistor. The system also includes a controller configured to operate the imaging sensor by selecting a different integration time for at least two photodiodes in a pixel based on light signals received by the pixel, performing a readout of the pixel, wherein a capacitance associated with the sense node is modified during the readout of the at least two photodiodes, and assembling an image using signals obtained from the plurality of pixels in the readout.

An example 2 includes the subject matter of example 1, wherein the at least two photodiodes comprise pinned photodiodes.

An example 3 includes the subject matter of any of examples 1 and 2, wherein the at least two photodiodes comprise p-type diodes.

An example 4 includes the subject matter of any of examples 1, 2, and 3, wherein the gain capacitor is a metal insulator metal ("MIM") capacitor.

An example 5 includes the subject matter of any of examples 1, 2, 3, and 4, wherein each pixel comprises four photodiodes coupled to the sense node.

An example 6 includes the subject matter of any of examples 1, 2, 3, 4, and 5, wherein a capacitance of the gain capacitor is selected based upon a predetermined dynamic range of the imaging sensor.

An example 7 includes the subject matter of any of examples 1, 2, 3, 4, 5, and 6, wherein the capacitance is in a range approximately between 1 fF/µm$^2$ and 10 fF/µm$^2$.

An example 8 includes the subject matter of any of examples 1, 2, 3, 4, 5, 6, and 7, wherein a size of each pixel is in a range approximately between 1 and 20 µm.

An example 9 includes the subject matter of any of examples 1, 2, 3, 4, 5, 6, 7, and 8, wherein at least one pixel in the array is responsive to a sub-band of a frequency spectrum describing the incident light.

An example 10 includes the subject matter of any of examples 1, 2, 3, 4, 5, 6, 7, 8, and 9, wherein at least one pixel in the array comprises a color filter.

In an example 11, a method for operating a pixel having two or more photodiodes coupled to a sense node, each photodiode controlled using a different transfer gate, the methods includes the steps of positioning the pixel to image a scene described by light signals that extend over a wide dynamic range, and selecting a different integration time for at least two photodiodes in the pixel based on light signals received by the pixel. The method also includes the steps of performing a readout of the pixel using a readout circuit connected to the sense node, wherein a capacitance associated with the sense node is modified during the readout of the at least two photodiodes.

An example 12 includes the subject matter of example 11, wherein the pixel comprises four pinned photodiodes coupled to the sense node.

An example 13 includes the subject matter of any of examples 11 and 12, wherein modifying the capacitance associated with the sense node comprises selectively connecting a gain capacitor to the sense node.

An example 14 includes the subject matter of any of examples 11, 12, and 13, wherein the integration time is in a range approximately between 1 ms and 1 sec.

An example 15 includes the subject matter of any of examples 11, 12, 13, and 14, wherein the method further comprises combining an accumulated charge of two or more photodiodes of the pixel.

An example 16 includes the subject matter of any of examples 11, 12, 13, 14, and 15, wherein different integration times are selected for two or more photodiodes to achieve a wide dynamic range for the pixel.

An example 17 includes the subject matter of any of examples 11, 12, 13, 14, 15, and 16, wherein the wide dynamic range is up to approximately 10,000,000:1.

An example 18 includes the subject matter of any of examples 11, 12, 13, 14, 15, 16, and 17, wherein the method further comprises filtering the incident light received by one or more photodiodes in the pixel.

An example 19 includes the subject matter of any of examples 11, 12, 13, 14, 15, 16, 17, and 18, wherein the method further comprises performing a readout of multiple pixels in an array to generate an image frame.

An example 20 includes the subject matter of any of examples 11, 12, 13, 14, 15, 16, 17, 18, and 19, wherein the integration time of one or more of the at least two photodiodes is selected based on information from a previous image frame.

The invention claimed is:

1. An apparatus, comprising:
an image sensor having an overall set of pixels making up the image sensor to capture an image,
where two or more pixels in the overall set of pixels each have an architecture that includes multiple photodiodes forming an individual pixel,
where a control system is configured to cooperate with each photodiode in the individual pixel to allow multiple pixels in the overall set of pixels to operate in a different imaging-mode of operation simultaneously within a first row making up the image, where a first set of pixels within the first row in a first window region operate in a first imaging-mode of operation while simultaneously a second set of pixels within the first row in a second window region operate in a second imaging-mode of operation, and
where the image sensor has multiple window regions, including the first window region and the second window region, making up a full field of vision of the image captured by the image sensor.

2. The apparatus of claim 1, where the image sensor is fabricated with at least two or more semiconductor layers, with a first layer having at least the two or more pixels having the architecture that includes the multiple photodiodes, and a second layer utilized to route wire traces for control signals including control signals going to i) transfer gates for each of the multiple photodiodes, and ii) a gate for a gain capacitor in each pixel of the image sensor in order to enable the different imaging-modes of operation for each pixel in the first row on a per pixel basis.

3. The apparatus of claim 1, where the control system is configured to use one or more decoders cooperating with a timer to direct control signals to i) transfer gates for each of the multiple photodiodes in the individual pixel to control an integration time for that photodiode, ii) a gate for a gain capacitor connecting to a common sense node to alter a gain applied to an accumulated charge from one or more of the photodiodes being sensed and read out, and iii) a gate for row select, where a first pixel is directed to operate in the first imaging-mode of operation in the first window and a second pixel in the first row is directed via the control signals to operate in the second imaging-mode of operation within the second window of the image.

4. The apparatus of claim 3, where the control system is configured to use
a first decoder cooperating with the timer to direct the control signals to the transfer gates for each of the multiple photodiodes and the gate for the row select transistor to tell the image sensor what one or more pixel locations and what row of the image sensor will be readout, and
a second decoder cooperating with the timer to direct the control signals to control an integration time for each photodiode and whether the gain capacitor should connect or not connect to the common sense node to control gain.

5. The apparatus of claim 1, where the control system is configured to use a controller cooperating with a timer to send control signals to bin together any combination of two or more photodiodes to collect and read out accumulated charge, at a same time, from the photodiodes binned together, where the controller cooperating with the timer is configured to pulse gates of all of the photodiodes binned together at a same time with other binned photodiodes of the control system while a remaining amount of photodiodes in the individual pixel have their control signals sent at a different time from the photodiodes binned together.

6. The apparatus of claim 1, where the control system is configured to use a controller and a timer to cooperate to enable an extended dynamic range imaging-mode of operation via i) having one or more pixels in a row configured to operate in a binned imaging-mode of operation to capture charge from the first set of pixels in the first row that are in low light conditions in the first window while ii) having one or more pixels in the second set of pixels in the first row configured to operate with a short integration time and low gain imaging-mode of operation to capture charge from the pixels in the second set of pixels in the image that are in bright light conditions in the second window, as well as iii) having other pixels in the first row configured to operate in a high frame rate imaging-mode of operation to eliminate blur in the other pixels when recording moving objects in a third window.

7. The apparatus of claim 1, where the control system is configured to use a controller and a timer cooperating to send control signals to enable a first pixel in the first row in the first window to operate in an extended dynamic range imaging-mode of operation while a second pixel in the first row to operate in a high frame rate imaging-mode of operation in the second window based on sensed imaging conditions in the first pixel and the second pixel.

8. The apparatus of claim 1, where the control system is configured to use two or more decoders cooperating with a timer to direct control signals to control i) frame rate, ii) integration times of the multiple photodiodes, and iii) binning of the multiple photodiodes on a per pixel basis to allow multiple pixels in the overall set of pixels to operate in a same imaging-mode of operation simultaneously within each row within a third window, all within a time frame of one image frame.

9. The apparatus of claim 1, where the control system is configured to use a controller and a timer that cooperate to place a first pixel in the first row into an extended dynamic-range imaging-mode of operation in the first window while sending control signals to a second pixel in the second window to operate in the second imaging-mode of operation, where the controller and the timer that cooperate send control signals to the multiple photodiodes such that at least two of the photodiodes are binned together.

10. The apparatus of claim 1, where the control system is configured to use one or more decoders cooperating with a timer and wire traces routed in a metallization layer, where the one or more decoders cooperating with the timer and the wire traces routed in the metallization layer direct control signals to enable each pixel to operate independently of another pixel, on a per pixel basis, in the first row.

11. A method for an image sensor, comprising:
fabricating an image sensor having an overall set of pixels making up the image sensor to capture an image,
fabricating two or more pixels in the overall set of pixels to each have an architecture that includes multiple photodiodes forming an individual pixel, and
configuring a control system to cooperate with each photodiode in the individual pixel to allow multiple pixels in the overall set of pixels to operate in a different imaging-mode of operation simultaneously within a first row making up the image, where the image sensor has multiple window regions making up a full field of vision of the image captured by the image sensor, where a first set of pixels within the first row in a first window region operate in a first imaging-mode of operation while simultaneously a second set of pixels within the first row in a second window region operate in a second imaging-mode of operation.

12. The method of claim 11, further comprising:
fabricating the image sensor with at least two or more semiconductor layers, with a first layer having pixels, and a second layer utilized to generate control signals and route wire traces for control signals including control signals going to i) transfer gates for each of the multiple photodiodes, and ii) a gate for a gain capacitor in each pixel in the first layer on a fabricated chip in order to enable the first and second imaging-modes of operation for each pixel in the first row on a per pixel; and thus, the multiple pixels in the overall set of pixels to operate in the different imaging modes of operation mode simultaneously within the first row in the first window and the second window.

13. The method of claim 11, further comprising:
configuring the control system to use one or more decoders cooperating with a timer to direct control signals to i) transfer gates for each of the multiple photodiodes in the individual pixel to control an integration time for that photodiode, ii) a gate for a gain capacitor connecting to a common sense node to alter a gain applied to an accumulated charge from one or more of the photodiodes being sensed and read out, and iii) a gate for row select transistor, where a first pixel is directed to operate in the first imaging-mode of operation and a second pixel in the first row is directed via the control signals to operate in the second imaging-mode of operation.

14. The method of claim 13, further comprising:
configuring the control system to use
a first decoder cooperating with the timer to direct the control signals to i) the transfer gates for each of the multiple photodiodes and iii) the gate for the row select transistor to tell the image sensor what one or more pixel locations and what row of the image sensor will be readout, and
a second decoder cooperating with the timer to direct the control signals to control an integration time for each photodiode and whether the gain capacitor should connect or not connect to the common sense node to control gain.

15. The method of claim 11, further comprising:
configuring the control system to use a controller cooperating with a timer to send control signals to bin together any combination of two or more photodiodes to collect and read out accumulated charge from the photodiodes binned together, where all of the photodiodes binned together will have their transfer gates pulsed at a same time with other binned photodiodes of the control system while a remaining amount of photodiodes in the individual pixel will have their control pulses occur at a different time from the photodiodes binned together, where photodiodes diagonally aligned in the individual pixel are binned together first.

16. The method of claim 11, further comprising:
configuring the control system to use two or more decoders cooperating with a timer to direct control signals to control i) frame rate, ii) integration times of the multiple photodiodes, and iii) binning of the multiple photodiodes on a per pixel basis to allow multiple pixels in the overall set of pixels to operate in a same imaging-mode of operation simultaneously within each row within a third window, all within a time frame of one image frame.

17. The method of claim 11, further comprising:
configuring the control system to a controller and a timer to cooperate to send control signals to enable a first pixel the overall set of pixels in the first window to operate in an extended dynamic-range imaging-mode of operation while a second pixel the overall set of pixels in the second window operates in a high frame rate imaging-mode of operation based on sensed imaging conditions in the first pixel and imaging conditions in the second pixel.

18. The method of claim 11, further comprising:
configuring the control system to use one or more decoders cooperating with a timer to direct control signals to one or more rows in the first window to operate in a high frame rate imaging-mode of operation and to a first pixel in the first row to operate with two or more photodiodes binned together with a second pixel in the first row based on sensed imaging conditions in the first pixel and imaging conditions in the second pixel.

19. The method of claim 11, further comprising:

configuring the control system to use a controller and a timer to cooperate to enable having one or more pixels in the first row in the first window to operate in a binned imaging-mode of operation to capture charge from the first set of in the first row that are in low light conditions while having one or more pixels in the first row in the second window to operate in a short integration time and low gain imaging-mode of operation to capture charge from the second set of pixels in the image that are in bright light conditions, and having other pixels in the first row when recording moving objects to operate in a high frame rate imaging-mode of operation to eliminate blur in the other pixels in a third window.

20. The method of claim 11, further comprising:

configuring the control system to use one or more decoders cooperating with a timer and wire traces routed in a metallization, where the one or more decoders cooperating with the timer and the wire traces routed in the metallization layer direct control signals to enable each pixel in the first row to operate independently of another pixel, on a per pixel basis.

* * * * *